(12) United States Patent
Liaw

(10) Patent No.: US 12,176,411 B2
(45) Date of Patent: Dec. 24, 2024

(54) SEMICONDUCTOR DEVICE WITH ISOLATION TRANSISTORS AND BACK SIDE VOLTAGE METAL LINES

(71) Applicant: Taiwan Semiconductor Manufacturing Company, Ltd., Hsinchu (TW)

(72) Inventor: Jhon-Jhy Liaw, Zhudong Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 431 days.

(21) Appl. No.: 17/574,000

(22) Filed: Jan. 12, 2022

(65) Prior Publication Data

US 2023/0223455 A1 Jul. 13, 2023

(51) Int. Cl.
- *H01L 29/423* (2006.01)
- *H01L 23/48* (2006.01)
- *H01L 29/06* (2006.01)
- *H01L 29/786* (2006.01)

(52) U.S. Cl.
CPC ...... *H01L 29/42392* (2013.01); *H01L 23/481* (2013.01); *H01L 29/0665* (2013.01); *H01L 29/78618* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2022/0058326 A1* | 2/2022 | Lee | G06F 30/392 |
| 2024/0008241 A1* | 1/2024 | Liaw | H01L 29/775 |

* cited by examiner

*Primary Examiner* — Nduka E Ojeh
(74) *Attorney, Agent, or Firm* — Birch, Stewart, Kolasch & Birch, LLP

(57) ABSTRACT

A semiconductor device includes circuit cells, isolation transistors at cell boundaries of the circuit cells, a first metal line under the isolation transistors, and connection structures connecting gate structures of the isolation transistors to the first metal line. Each of the circuit cells includes functional transistors having source/drain features and nanostructures. The isolation transistors electrically isolate the circuit cells from each other. Nanostructures of the isolation transistors, the source/drain features of the functional transistors, and the nanostructures of the functional transistors are connected with each other into a continuous rectangular shape from a top view.

20 Claims, 22 Drawing Sheets

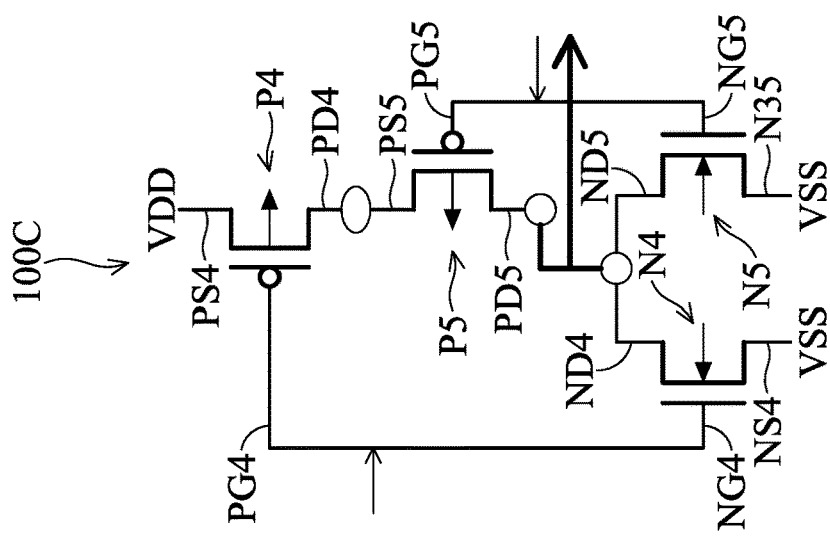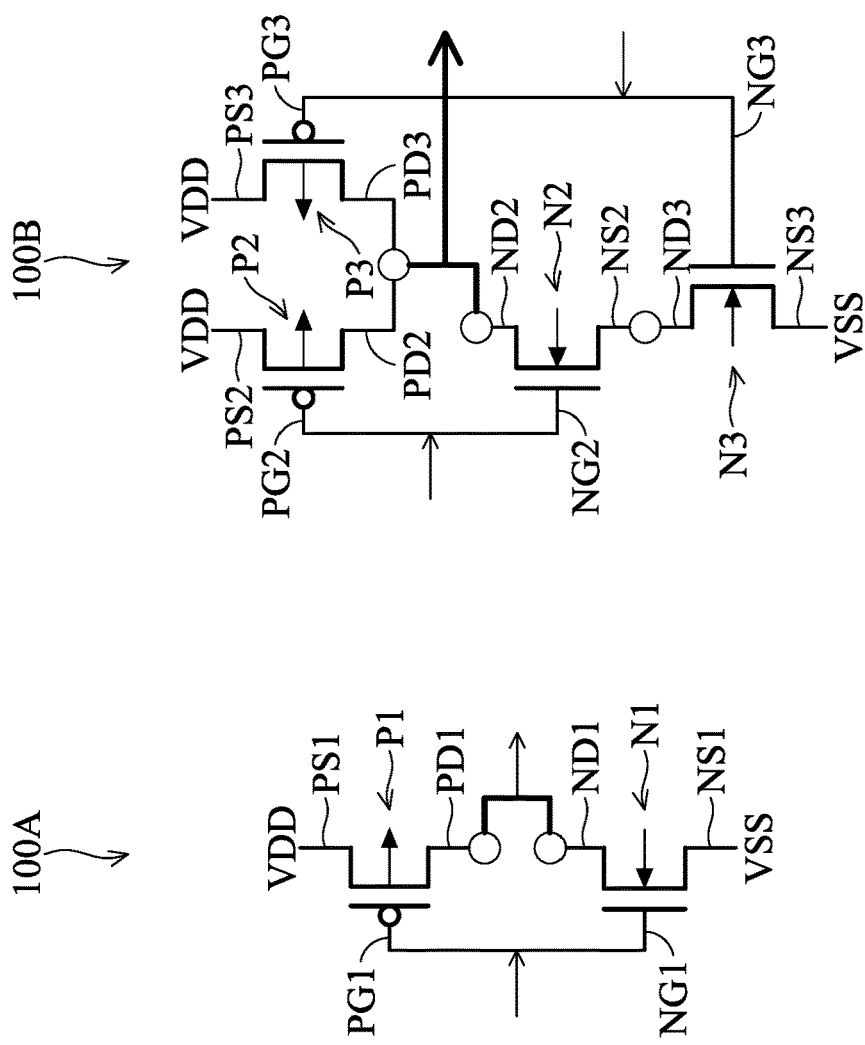
FIG. 1C
FIG. 1B
FIG. 1A

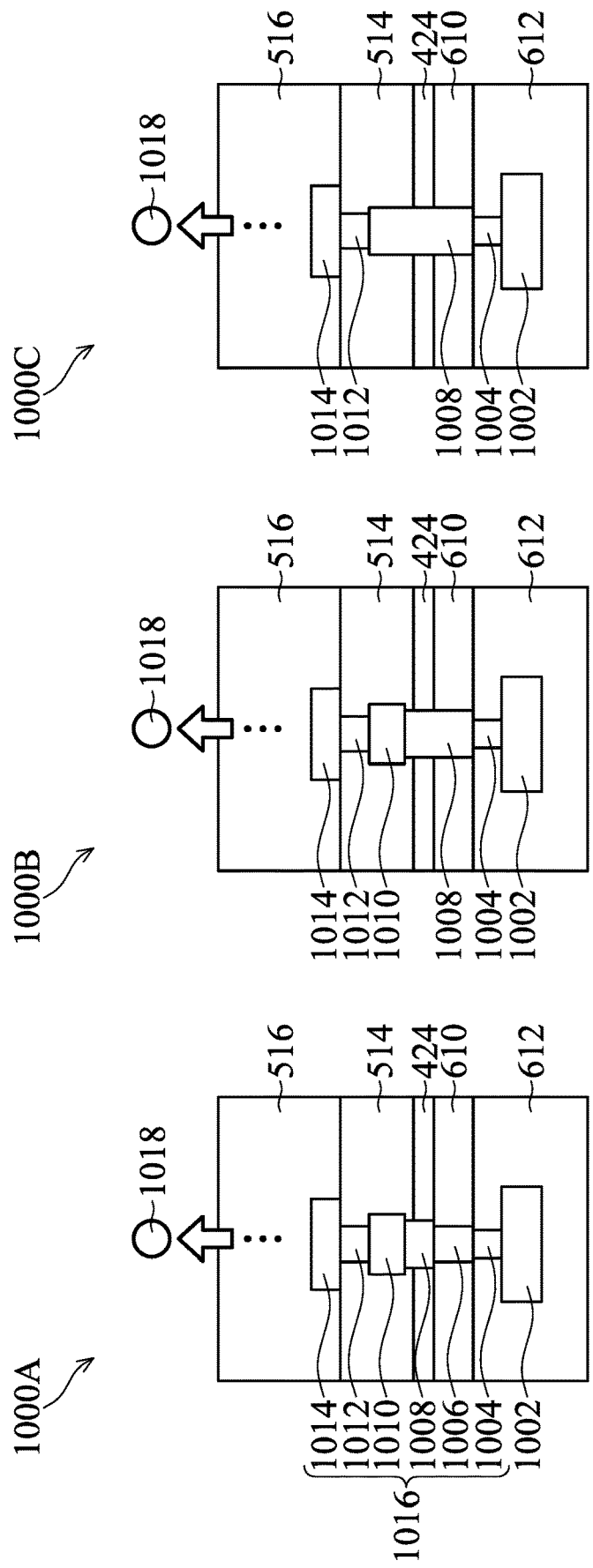

SEMICONDUCTOR DEVICE WITH ISOLATION TRANSISTORS AND BACK SIDE VOLTAGE METAL LINES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, gate-all-around (GAA) transistors have been incorporated into memory devices (including, for example, static random-access memory, or SRAM, cells) and core devices (including, for example, standard logic, or STD, cells) to reduce chip footprint while maintaining reasonable processing margins.

However, as GAA transistors and circuit cells continue to be scaled down, VDD and VSS power routing uses too many routing resources and therefore impact the cell scaling as well as cell performance. Accordingly, although existing technologies for fabricating circuit cells including GAA transistors have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A, 1B, 1C, 1D, and 1E are circuit schematics of embodiments of various STD cells of the present disclosure, in accordance with some embodiments.

FIGS. 4A and 4B illustrate top views (or layouts) of an embodiment of a semiconductor device of the present disclosure, in which FIG. 4A illustrates the features in the device region and the front side interconnect structure, and FIG. 4B illustrates the features in the device region and the back side interconnect structure.

FIGS. 5A and 5B illustrate top views (or layouts) of an embodiment of a semiconductor device of the present disclosure, in which FIG. 5A illustrates the features in the device region and the front side interconnect structure, and FIG. 5B illustrates the features in the device region and the back side interconnect structure.

FIGS. 6A and 6B illustrate top views (or layouts) of an embodiment of a semiconductor device of the present disclosure, in which FIG. 6A illustrates the features in the device region and the front side interconnect structure, and FIG. 6B illustrates the features in the device region and the back side interconnect structure.

FIGS. 7A and 7B illustrate top views (or layouts) of an embodiment of a semiconductor device of the present disclosure, in which FIG. 7A illustrates the features in the device region and the front side interconnect structure, and FIG. 7B illustrates the features in the device region and the back side interconnect structure.

FIGS. 8A, 8B, and 8C illustrate cross sectional views of an embodiment of connection structures for connecting the voltage line from the back side to voltage source at the front side, in accordance with some embodiments.

DETAILED DESCRIPTION

Figure 1D:
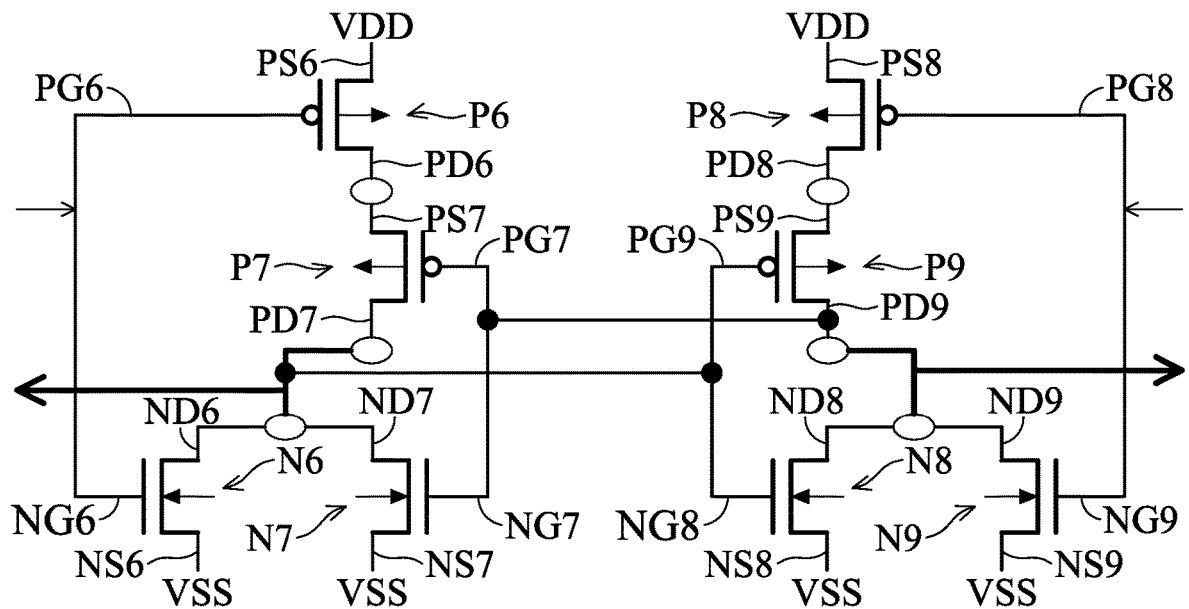

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to circuit cells having field-effect transistors (FETs), such as three-dimensional gate-all-around (GAA) transistors, in an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it should be understood that other embodiments may offer different advantages, not all advantages are necessarily discussed herein, and no particular advantage is required for all embodiments. For example, embodiments discussed herein include circuit cells with continuous active areas including source/drain features and channels of the functional transistors and channels of the isolation transistors connected with each other, as well as voltage lines under the functional transistors and the isolation transistors, such that improve cell performance and reduce routing complexity for circuit cells. The details of the present disclosure are described below in conjunction with the accompanying drawings, which illustrate the layout and structure of circuit cells, according to some embodiments.

In the present disclosure, circuit cells may include various logic cells or standard (STD) cells. The logic cells or STD cells may be Inverters, NANDs, NORs, ANDs, ORs, flip-flops, SCANs, or random combined by above cells, or specific functional circuits. FIGS. 1A to 1E are circuit schematics of embodiments of various STD cells of the present disclosure, in accordance with some embodiments.

FIG. 1A shows an inverter 100A including an N-type transistor N1 and a P-type transistor P1. The N-type transistor N1 includes a source terminal NS1, a drain terminal ND1, and a gate terminal NG1, and the P-type transistor P1 includes a source terminal PS1, a drain terminal PD1, and a gate terminal PG1.

As shown in FIG. 1A, the gate terminals NG1 and PG1 are coupled with each other to operate as an input terminal of the inverter 100A. The drain terminals ND1 and PD1 are coupled with each other to operate as an output terminal of the inverter 100A. The source terminal PS1 is coupled to a VDD voltage. The source terminal NS1 is coupled to a VSS voltage (or a ground voltage).

FIG. 1B shows a NAND (also referred to as a NAND logic gate, a NAND device or a NAND cell) 100B including N-type transistors N2, N3 and P-type transistors P2, P3. The N-type transistor N2 includes a source terminal NS2, a drain terminal ND2, and a gate terminal NG2, and the N-type transistor N3 includes a source terminal NS3, a drain terminal ND3, and a gate terminal NG3. The P-type transistor P2 includes a source terminal PS2, a drain terminal PD2, and a gate terminal PG2, and the P-type transistor P3 includes a source terminal PS3, a drain terminal PD3, and a gate terminal PG3.

As shown in FIG. 1B, the gate terminals NG2 and PG2 are coupled with each other to operate as a first input terminal of the NAND 100B, and the gate terminals NG3 and PG3 are coupled with each other to operate as a second input terminal of the NAND 100B. The drain terminals ND2, PD2, and PD3 are coupled with each other to operate as an output terminal of the NAND 100B. In some embodiments, the connection of the drain terminals ND2, PD2, and PD3 are referred to as "common drain." The source terminals PS2 and PS3 are coupled to the VDD voltage. The source terminal NS3 is coupled to VSS voltage. The source terminal NS2 and drain terminal ND3 are coupled with each other, and also referred to as "common active area (or common OD)."

FIG. 1C shows a NOR (also referred to as a NOR logic gate, a NOR device or a NOR cell) 100C including N-type transistors N4, N5 and P-type transistors P4, P5. The N-type transistor N4 includes a source terminal NS4, a drain terminal ND4, and a gate terminal NG4, and the N-type transistor N5 includes a source terminal NS5, a drain terminal ND5, and a gate terminal NG5. The P-type transistor P4 includes a source terminal PS4, a drain terminal PD4, and a gate terminal PG4, and the P-type transistor P5 includes a source terminal PS5, a drain terminal PD5, and a gate terminal PG5.

As shown in FIG. 1C, the gate terminals NG4 and PG4 are coupled with each other to operate as a first input terminal of the NOR 100C, and the gate terminals NG5 and PG5 are coupled with each other to operate as a second input terminal of the NOR 100C. The drain terminals ND4, ND5, and PD5 are coupled with each other to operate as an output terminal of the NOR 100C. In some embodiments, the connection of the drain terminals ND4, ND5, and PD5 are referred to as "common drain." The source terminal PS4 is coupled to the VDD voltage. The source terminals NS4 and NS5 are coupled to VSS voltage. The source terminal PS5 and drain terminal PD4 are coupled with each other, and also referred to as "common active area (or common OD)."

FIG. 1D shows a flip-flop (also referred to as a flip-flop device or a flip-flop cell) 100D including N-type transistors N6, N7, N8, N9 and P-type transistors P6, P7, P8, P9. The N-type transistor N6 includes a source terminal NS6, a drain terminal ND6, and a gate terminal NG6; the N-type transistor N7 includes a source terminal NS7, a drain terminal ND7, and a gate terminal NG7; the N-type transistor N8 includes a source terminal NS8, a drain terminal ND8, and a gate terminal NG8; and the N-type transistor N9 includes a source terminal NS9, a drain terminal ND9, and a gate terminal NG9. The P-type transistor P6 includes a source terminal PS6, a drain terminal PD6, and a gate terminal PG6; the P-type transistor P7 includes a source terminal PS7, a drain terminal PD7, and a gate terminal PG7; the P-type transistor P8 includes a source terminal PS8, a drain terminal PDB, and a gate terminal PG8; and the P-type transistor P9 includes a source terminal PS9, a drain terminal PD9, and a gate terminal PG9.

As shown in FIG. 1D, the flip-flop 100D is a set-reset (SR) NOR latch. The NOR latch may include a pair of cross-coupled NOR. Specifically, the output terminal of a first NOR is coupled to the second input terminal of a second NOR, and the output terminal of the second NOR is coupled to the second input terminal of the first NOR. The details of the other connections of the flip-flop 100D are similar to the NOR 100C, and may not be described in detail herein.

Figure 1E:
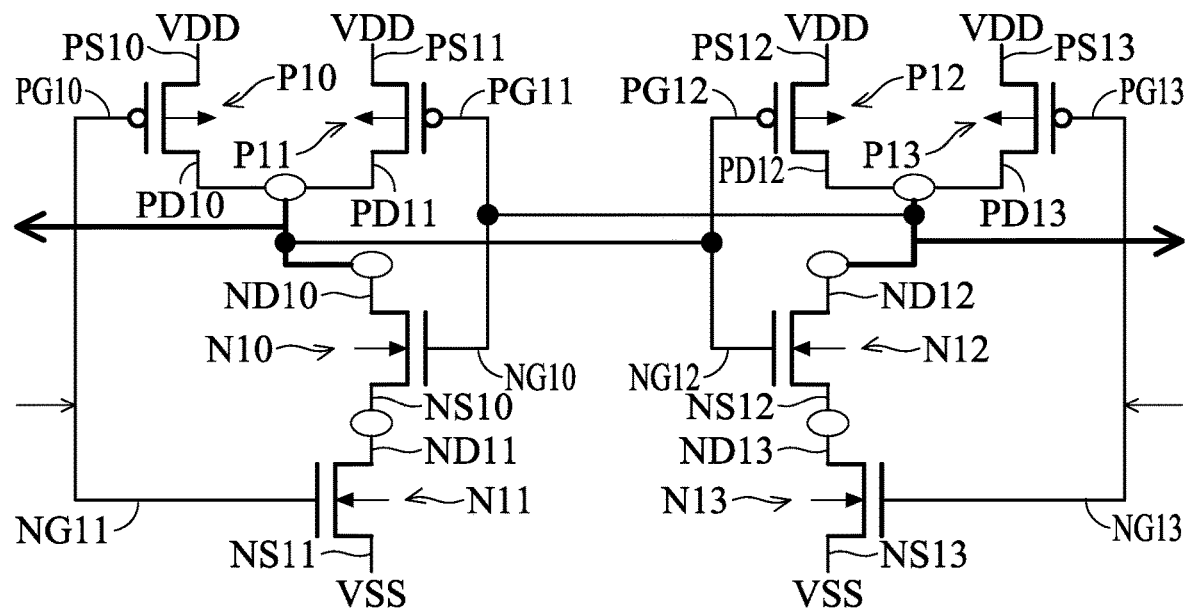

FIG. 1E shows a flip-flop 100E including N-type transistors N10, N11, N12, N13 and P-type transistors P10, P11, P12, P13. The N-type transistor N10 includes a source terminal NS10, a drain terminal ND10, and a gate terminal NG10; the N-type transistor N11 includes a source terminal NS11, a drain terminal ND11, and a gate terminal NG11; the N-type transistor N12 includes a source terminal NS12, a drain terminal ND12, and a gate terminal NG12; and the N-type transistor N13 includes a source terminal NS13, a drain terminal ND13, and a gate terminal NG13. The P-type transistor P10 includes a source terminal PS10, a drain terminal PD10, and a gate terminal PG10; the P-type transistor P11 includes a source terminal PS11, a drain terminal PD11, and a gate terminal PG11; the P-type transistor P12 includes a source terminal PS12, a drain terminal PD12, and a gate terminal PG12; and the P-type transistor P13 includes a source terminal PS13, a drain terminal PD13, and a gate terminal PG13.

As shown in FIG. 1E, the flip-flop 100E is a SR NAND latch. The NAND latch may include a pair of cross-coupled NAND. Specifically, the output terminal of a first NAND is coupled to the first input terminal of a second NAND, and the output terminal of the second NAND is coupled to the first input terminal of the first NAND. The details of the other connections of the flip-flop 100E are similar to the NAND 100B, and may not be described in detail herein.

Figure 2:
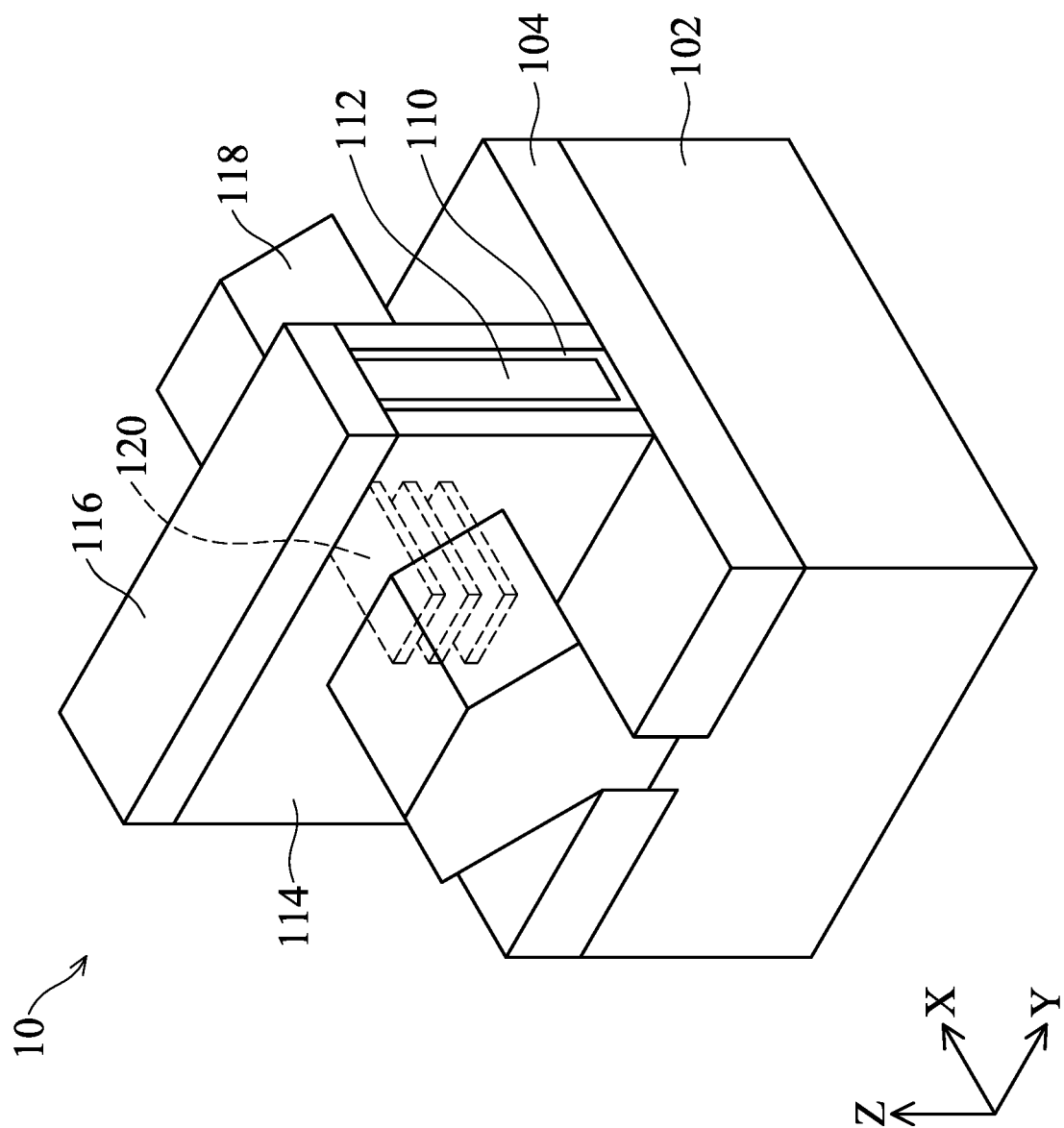
FIG. 2 illustrates a perspective view of an embodiment of a GAA transistor of the present disclosure, in accordance with some embodiments.

Each of the circuit cells discussed above is constructed by transistors. The transistors may be planar transistors, fin field-effect transistor (FinFET) transistors, gate-all-around (GAA) transistors, nano-wire transistors, nano-sheet transistors, or a combination thereof. For the sake of providing an example, an exemplary GAA transistor is illustrated in FIG. 2. However, it should be understood that the application should not be limited to a particular type of device, except as specifically claimed.

Referring to FIG. 2, a perspective view of an exemplary GAA transistor 10 is illustrated. The GAA transistor 10 includes a substrate 102. The substrate 102 may contains a semiconductor material, such as bulk silicon (Si). In some other embodiments, the substrate 102 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 102 may also include an insulating layer, such as a silicon oxide layer, to have a silicon-on-insulator (SOI) structure or a germanium-on-insulator (GOI) structure. In some embodiments, after the resultant GAA transistor 10 is formed, the substrate 102 may be removed by a suitable process (e.g., a chemical mechanical polishing (CMP) process) for forming back side interconnections.

The GAA transistor 10 also includes one or more nanostructures 120 (dash lines) extending in an X-direction and vertically arranged (or stacked) in a Z-direction. More specifically, the nanostructures 120 are spaced from each other in the Z-direction. In some embodiments, the nanostructures 120 may also be referred to as channels, channel layers, nanosheets, or nanowires. The nanostructures 120 may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures 120 include silicon for N-type GAA transistors. In other embodiments, the nanostructures 120 include silicon germanium for P-type GAA transistors. In some embodiments, the nanostructures 120 are all made of silicon, and the type of GAA transistors depend on work function metal layer wrapping around the nanostructures 120.

The GAA transistor 10 further includes a gate structure including a gate electrode 112 and a gate dielectric layer 110. The gate dielectric layer 110 wraps around the nanostructures 120 and the gate electrode 112 wraps around the gate dielectric layer 110 (not shown in FIG. 2, may refer to FIGS. 4C and 4D). The gate electrode 112 may include polysilicon or work function metal. The work function metal includes TiN, TaN, TiAl, TiAlN, TaAl, TaAlN, TaAlC, TaCN, WNC, Co, Ni, Pt, W, combinations thereof, or other suitable material.

In some embodiments, the gate electrode 112 may include a capping layer, a barrier layer, an n-type work function metal layer, a p-type work function metal layer, and a fill material (not shown).

The gate dielectric layer 110 may include dielectric materials, such as silicon oxide, silicon nitride, silicon oxynitride, dielectric material(s) with high dielectric constant (high-k), or a combination thereof. Examples of high-k dielectric materials include $TiO_2$, $HfZrO$, $Ta_2O_3$, $HfSiO_4$, $ZrO_2$, $ZrSiO_2$, $LaO$, $AlO$, $ZrO$, $TiO$, $Ta_2O_5$, $Y_2O_3$, $SrTiO_3$ (STO), $BaTiO_3$ (BTO), $BaZrO$, $HfLaO$, $HfSiO$, $LaSiO$, $AlSiO$, $HfTaO$, $HfTiO$, $(Ba,Sr)TiO_3$ (BST), $Al_2O_3$, $Si_3N_4$, oxynitrides (SiON), combinations thereof, or other suitable material.

As shown in FIG. 2, gate spacers 114 are on sidewalls of the gate dielectric layer 110 and over the nanostructures 120 (not shown). The gate spacers 114 may include multiple dielectric materials and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 114 may include a single layer or a multi-layer structure.

The gate top dielectric layer 116 is over the gate dielectric layer 110, the gate electrode 112, and the nanostructures 120. The gate top dielectric layer 116 is used for contact etch protection layer. The material of gate top dielectric layer 116 is selected from a group consisting of oxide, SiOC, SiON, SiOCN, nitride base dielectric, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), combinations thereof, or other suitable material.

The GAA transistor 10 further includes epitaxially-grown materials 118. As shown in FIG. 2, two epitaxially-grown materials 118 are on opposite sides of the gate structure. The epitaxially-grown materials 118 serve as the source/drain features of the GAA transistor 10. Therefore, the epitaxially-grown materials 118 may also be referred to as source/drain, source/drain features, or source/drain regions. In some embodiments, for an N-type GAA transistor, the epitaxially-grown materials 118 may include SiP, SiC, SiPC, SiAs, Si, or a combination thereof. In some embodiments, for a P-type GAA transistor, the epitaxially-grown materials 118 may include SiGe, SiGeC, Ge, Si, a boron-doped SiGe, boron and carbon doped SiGe, or a combination thereof.

The nanostructures 120 (dash lines) extends in an X-direction to connect two epitaxially-grown materials 118. Such the nanostructures 120 and the epitaxially-grown materials 118 connected continuously with each other may be collectively referred to as an active area.

Isolation feature 104 is over the substrate 102 and under the gate dielectric layer 110, the gate electrode 112, and the gate spacers 114. The isolation feature 104s used for isolating the GAA transistor 10 from other devices. In some embodiments, the isolation feature 104 may include different structures, such as shallow trench isolation (STI) structure, deep trench isolation (DTI) structure. Therefore, the isolation feature 104 is also referred as to as a STI feature or DTI feature.

Figure 3:
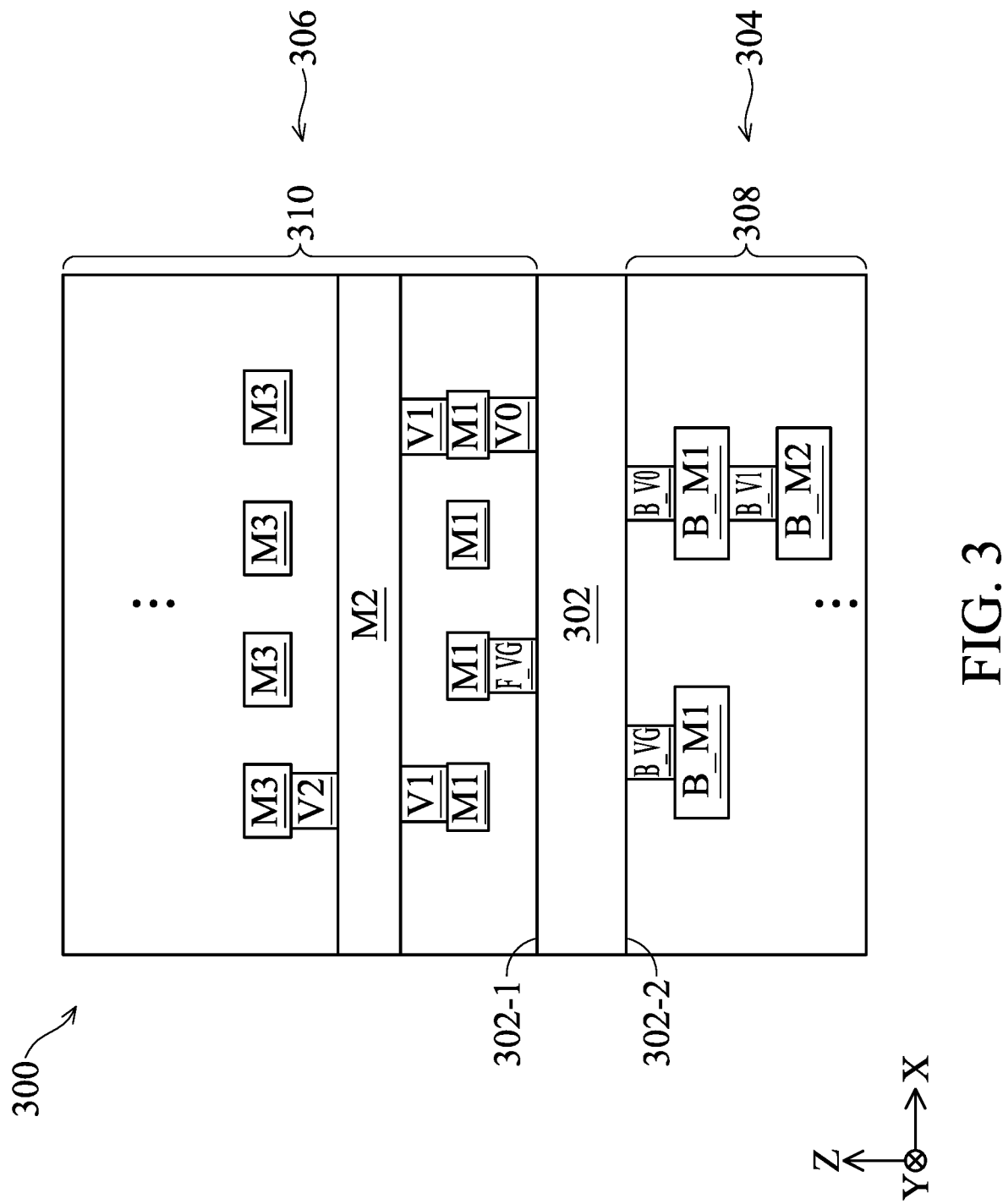
FIG. 3 illustrates a cross sectional view of an embodiment of a semiconductor device of the present disclosure, in accordance with some embodiments.

FIG. 3 illustrates a cross sectional view of an embodiment of a semiconductor device 300 of the present disclosure, in accordance with some embodiments. The semiconductor device 300 has device region 302 (also referred to as a device layer), back side interconnect structure 304, and front side interconnect structure 306. The device region 302 is the region where the transistors and main features are located, such as gate, channel, source/drain, contact features, and the transistors (e.g., the N-type transistors N1 to N13, and the P-type transistors P1 to P13) of the circuit cells discussed above. The device region 302 has front side 302-1 and back side 302-2. The back side interconnect structure 304 is under the device region 302 or at the back side 302-2 of the device region 302, and the front side interconnect structure 306 is over the device region 302 or at the front side 302-1 of the device region 302. The back side interconnect structure 304 includes inter-metal dielectric (IMD) 308, vias B_VG, B_V0, B_V1, and metal lines B_M1, B_M2. The front side interconnect structure 306 includes IMD 310, vias F_VG, V0, V1, V2, and metal lines M1, M2, M3. The vias and metal lines in the IMD 308 and 310 electrically couples various transistors (e.g., the N-type transistors N1 to N13, and the P-type transistors P1 to P13, other transistors) and/or components (for example, gate, source/drain features, resistors, capacitors, and/or inductors) in the device region 302, such that the various devices and/or components can operate as specified by design requirements of circuit cell (e.g., inverter 100A, NAND 100B, NOR 100C, flip-flop 100D, and flip-flop 100E, other logic cells, or other STD cells). It should be noted that there may be more vias and metal lines in the IMD 308 and 310 for connections. The IMD 308 and 310 may be multilayer structure, such as one or more dielectric layers.

Since the back side interconnect structure 304 is at the back side 302-2 of the device region 302, the IMD 308, the vias B_VG, B_V0, B_V1, and the metal lines B_M1, B_M2 may also be referred to as the back side IMD, the back side vias, and the back side metal lines, respectively. Since the front side interconnect structure 306 is at the front side 302-1 of the device region 302, the IMD 310, the vias F_VG, V0, V1, V2, and the metal lines M1, M2, M3 may also be referred to as the front side IMD, the front side vias, and the front side metal lines, respectively. In some embodiments, the vias B_VG and VG are connected to the gate structures (gate electrodes) of the transistors. Therefore, the vias B_VG and F_VG are also referred to as the gate vias, or respectively referred to as the back side gate via and the front side gate via. In some embodiments, the vias and metal lines in the IMD 310 are used for the connections of the features of the transistor. In some embodiments, the vias and metal lines in the IMD 308 are connected to voltage sources (not shown) to provide voltage to the transistors in the device region 302. Therefore, the metal lines (e.g., the metal lines B_M1, B_M2) in the IMD 308 may be also referred to as the voltage metal lines, the voltage lines, or voltage conductors.

The formation of the back side interconnect structure 304 may include removing the substrate (if present) by CMP process, forming a back side dielectric layer (not shown) under the device region 302, forming back side contacts (not shown) connected to the source/drain features in the device region 302 in the back side dielectric layer, forming a first dielectric layer of the IMD 308 under the back side dielectric layer, forming back side first level vias (e.g., the vias B_VG and B_V0) in the first dielectric layer, forming a second dielectric layer of the IMD 308 under the first dielectric layer, forming back side first level metal lines (e.g., the metal lines B_M1) in the second dielectric layer, forming a third dielectric layer of the IMD 308 under the second dielectric layer, forming back side second level vias (e.g., the via B_V1) in the third dielectric layer, forming a fourth dielectric layer of the IMD 308 under the third dielectric layer, forming back side second level metal lines (e.g., the metal line B_M2) in the fourth dielectric layer, and forming protection layer (may be multiple layers and include dielectric layers, poly layers, or combination) under the fourth dielectric layer. The formation of the front side interconnect structure 306 is similar to that of back side interconnect structure 304, in which the difference is that the formation processes of the front side interconnect structure 306 are performed at the front side 302-1 of the device region 302, and may not be described in detail herein.

Figure 4A:
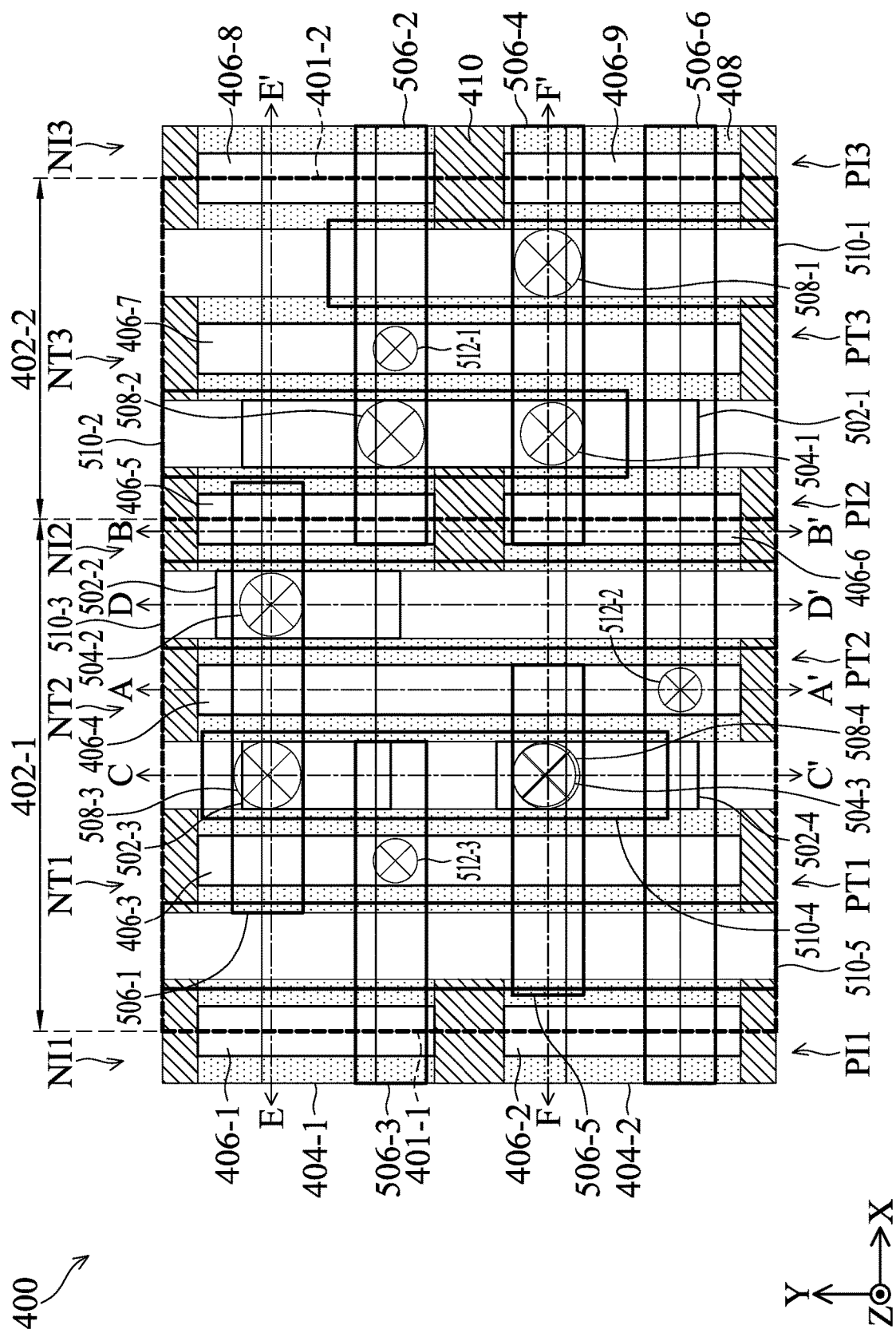
Figure 4B:
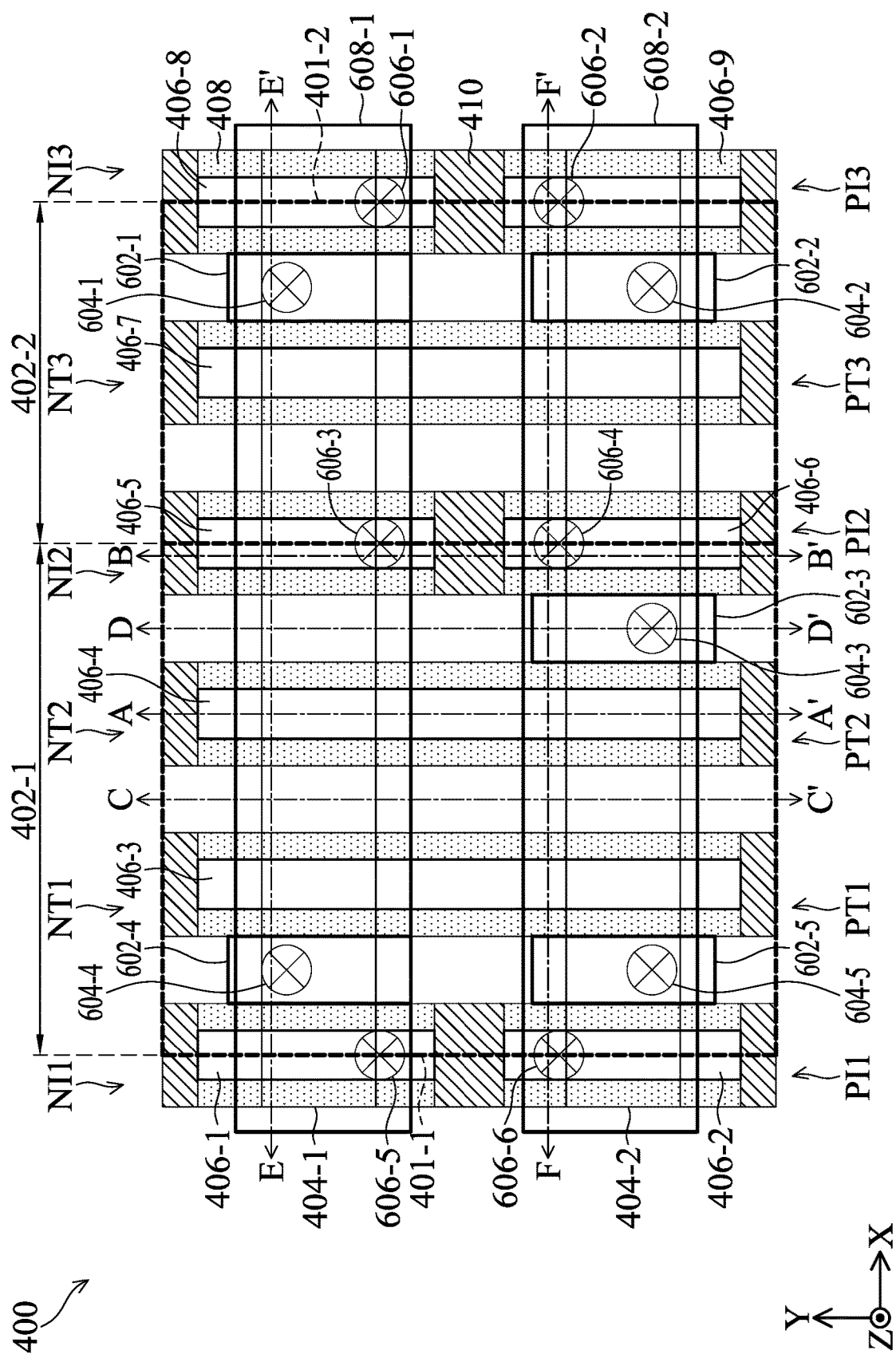

FIGS. 4A and 4B illustrate top views (or layouts) of an embodiment of a semiconductor device 400 of the present disclosure, in accordance with some embodiments. FIG. 4A illustrates the features in the device region (including transistors) and the front side interconnect structure (including vias and metal lines), and FIG. 4B illustrates the features in the device region and the back side interconnect structure.

Figures 4C, 4D:
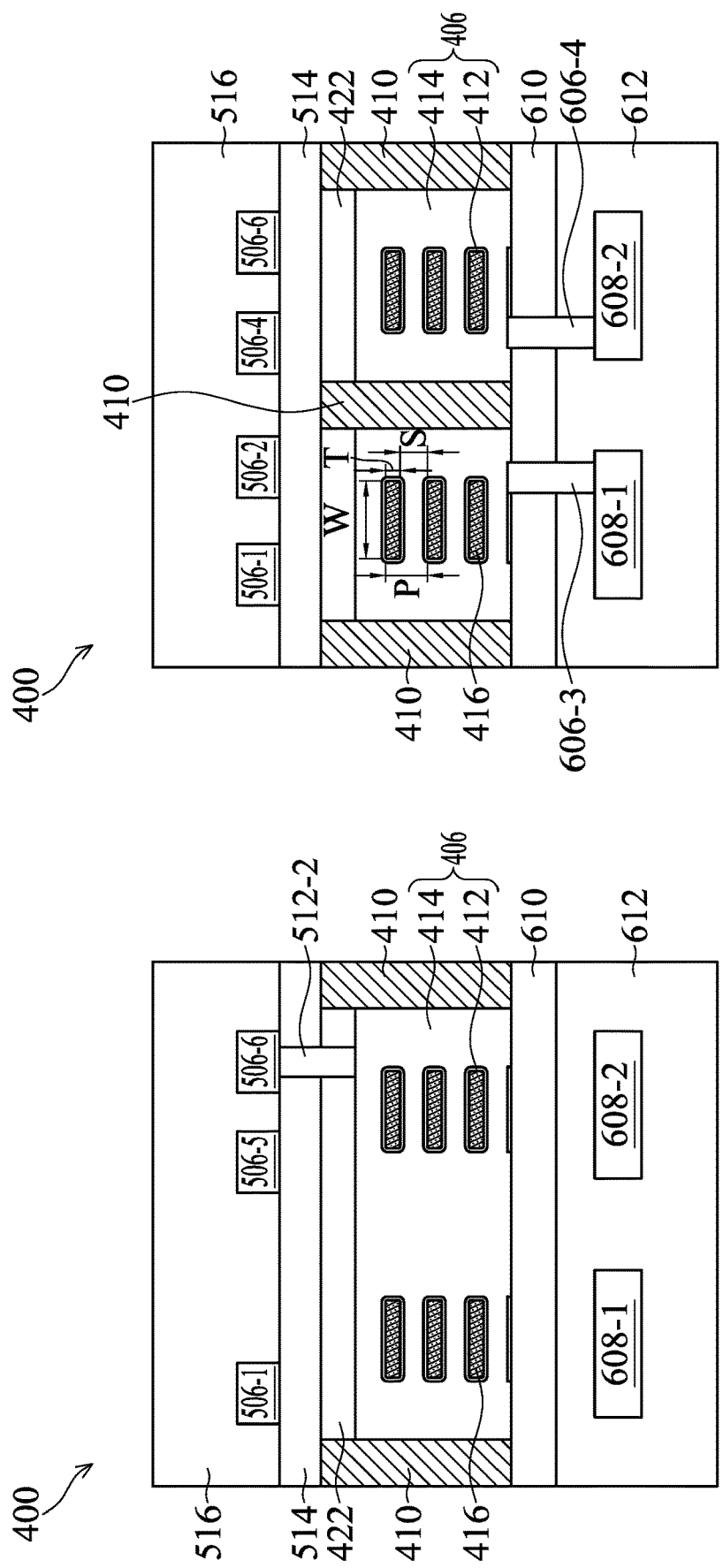
FIG. 4C illustrates a cross sectional view of an embodiment of the semiconductor device along a line A-A' in FIGS. 4A and 4B, in accordance with some embodiments.
FIG. 4D illustrates a cross sectional view of an embodiment of the semiconductor device along a line B-B' in FIGS. 4A and 4B, in accordance with some embodiments.
Figure 4F:
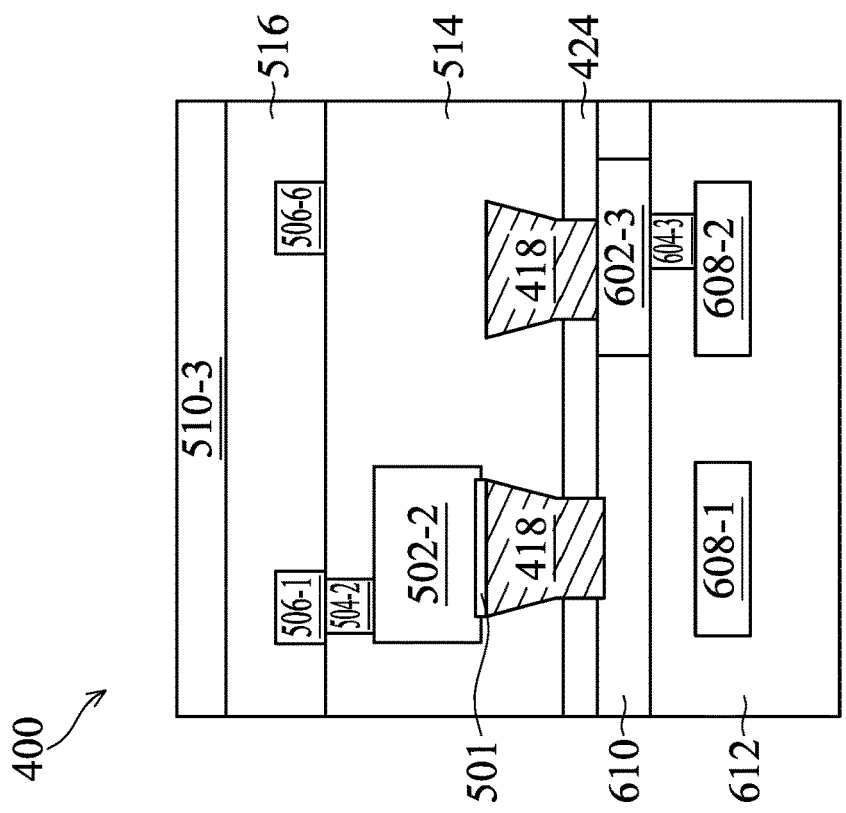
FIG. 4F illustrates a cross sectional view of an embodiment of the semiconductor device along a line D-D' in FIGS. 4A and 4B, in accordance with some embodiments.
Figure 4E:
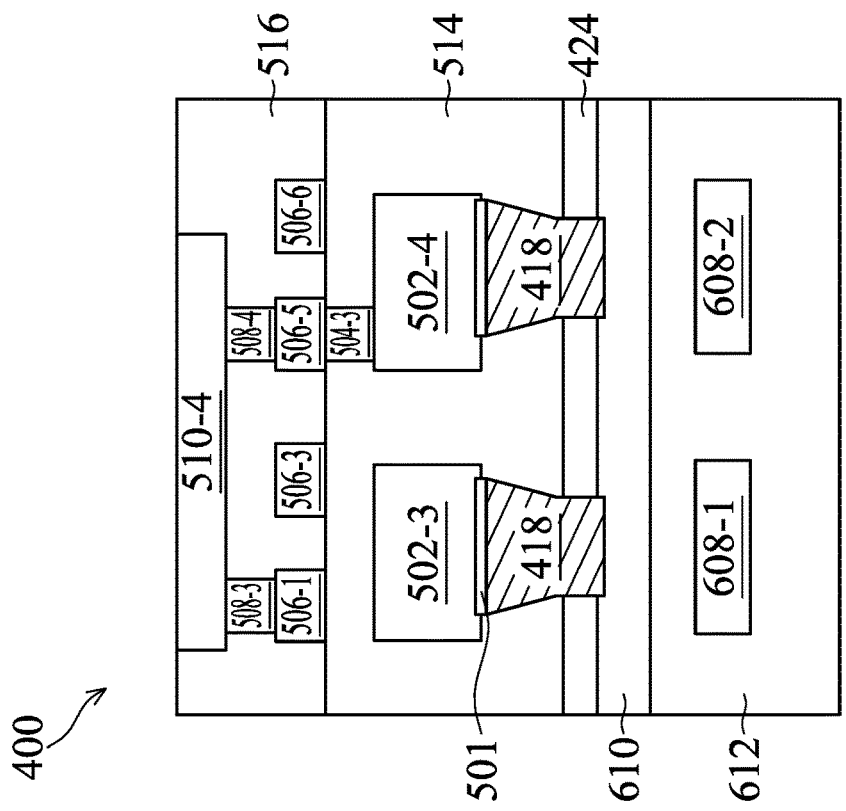
FIG. 4E illustrates a cross sectional view of an embodiment of the semiconductor device along a line C-C' in FIGS. 4A and 4B, in accordance with some embodiments.
Figure 4G:
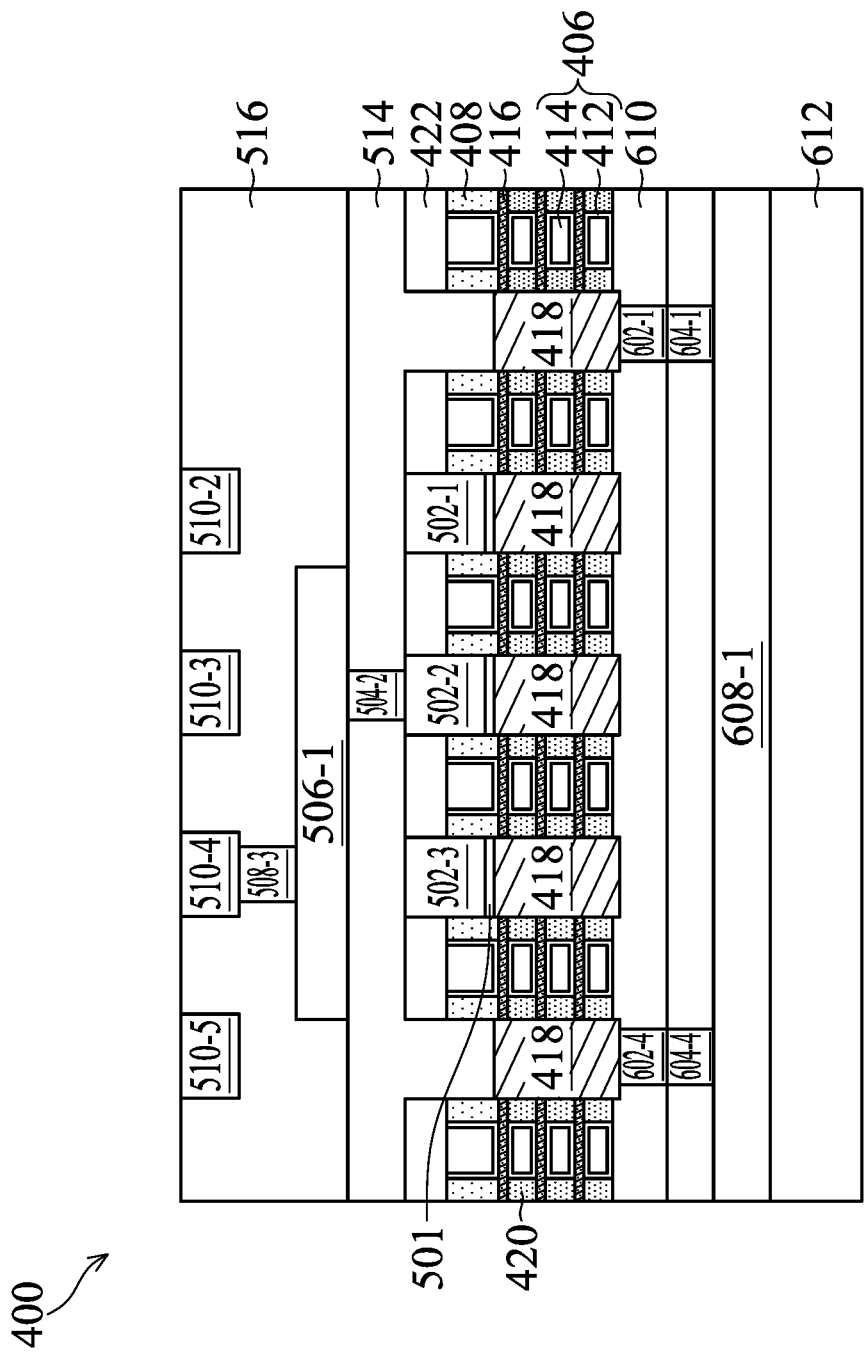
FIG. 4G illustrates a cross sectional view of an embodiment of the semiconductor device along a line E-E' in FIGS. 4A and 4B, in accordance with some embodiments.
Figure 4H:
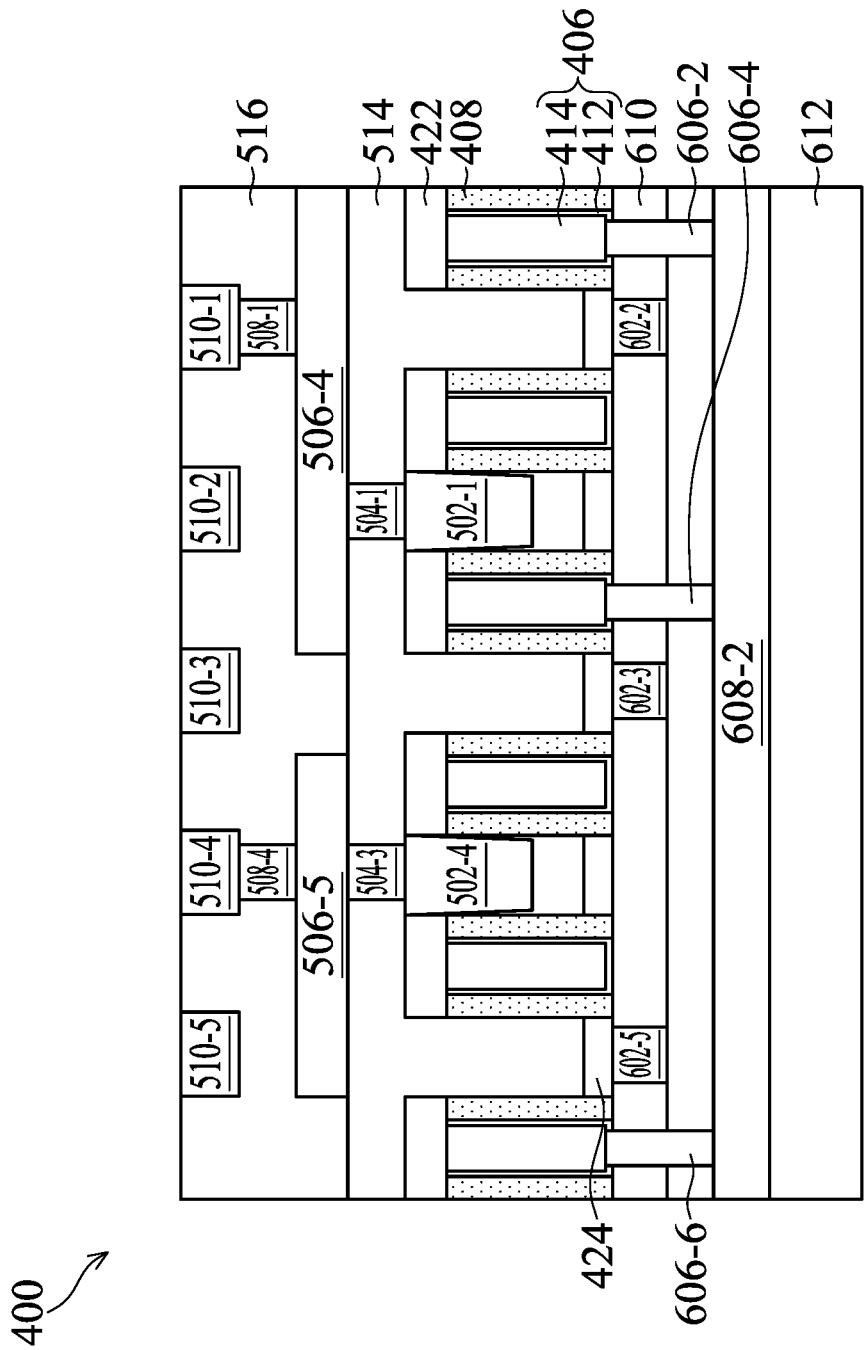
FIG. 4H illustrates a cross sectional view of an embodiment of the semiconductor device along a line F-F' in FIGS. 4A and 4B, in accordance with some embodiments.

FIG. 4C illustrates a cross sectional view of an embodiment of the semiconductor device 400 along a line A-A' in FIGS. 4A and 4B, in accordance with some embodiments. FIG. 4D illustrates a cross sectional view of an embodiment of the semiconductor device 400 along a line B-B' in FIGS. 4A and 4B, in accordance with some embodiments. FIG. 4E illustrates a cross sectional view of an embodiment of the semiconductor device 400 along a line C-C' in FIGS. 4A and 4B, in accordance with some embodiments. FIG. 4F illustrates a cross sectional view of an embodiment of the semiconductor device 400 along a line D-D' in FIGS. 4A and 4B, in accordance with some embodiments. FIG. 4G illustrates a cross sectional view of an embodiment of the semiconductor device 400 along a line E-E' in FIGS. 4A and 4B, in accordance with some embodiments. FIG. 4H illustrates a cross sectional view of an embodiment of the semiconductor device 400 along a line F-F' in FIGS. 4A and 4B, in accordance with some embodiments.

The semiconductor device 400 may include circuit cells, for example memory cells such as static random access memory (SRAM) cells, and/or standard circuit cells (also referred to STD cells). As discussed above, the STD cells may include logic circuits or logic devices, including but not limited to logic circuits such as inverters, NANDs, NORs, flip-flops, or a combination thereof. For the sake of providing an example, FIG. 4A shows two circuit cells 402: circuit cell 402-1, which includes a NAND, and circuit cell 402-2, which includes an inverter. It should be understood that the circuit cell 402-1 (including the NAND) and the circuit cell 402-2 (including the inverter) are merely examples. The present disclosure applies to other types of STD cells as well, for example cells including NORs, ANDs, ORs, flip-flops, or a combination thereof.

Referring to FIGS. 4A to 4H, the semiconductor device 400 includes active areas 404 (including active areas 404-1 and 404-2). The active areas 404 each extends in the X-direction and has a continuous rectangular shape in the top view. In some embodiments, the active areas 404 each include nanostructures 416 and source/drain features 418 of transistors connected with each other. The semiconductor device 400 further includes gate structures 406 (including gate structures 406-1 to 406-9) extending in the Y-direction. The gate structures 406 engage the active areas 404 to form transistors NT1, NT2, PT1, and PT2 for the circuit cell 402-1 (may respectively correspond to N-type transistor N3, N-type transistor N2, P-type transistor P3, and P-type transistor P2 discussed above), transistors NT3 and PT3 for the circuit cell 402-2 (may respectively correspond to N-type transistor N1 and P-type transistor P1 discussed above), and isolation transistors NI1, NI2, NI3, PI1, PI2, and PI3. The transistors NT1, NT2, NT3, PT1, PT2, and PT3 used for circuit cells are also referred to as functional transistors.

In some embodiments, the transistors NT1, NT2, and NT3 and isolation transistors NI1, NI2, and NI3 are N-type, and thus are also referred to as N-type transistors and N-type isolation transistors. In some embodiments, the transistors PT1, PT2, and PT3 and isolation transistors PI1, PI2, and PI3 are P-type, and thus are also referred to as P-type transistors and P-type isolation transistors. As shown in FIGS. 4A and 4B, the transistors NT1, NT2, and NT3 and isolation transistors NI1, NI2, and NI3 are arranged in the X-direction. The transistors NT1, NT2, and NT3 and isolation transistors NI1, NI2, and NI3 are also arranged in the X-direction, and respectively adjacent to the transistors PT1, PT2, and PT3 and isolation transistors PI1, PI2, and PI3 in the Y-direction. The isolation transistors NI1, NI2, NI3, PI1, PI2, and PI3 are at cell boundaries 401 (including a cell boundary 401-1 of the circuit cell 402-1 and a cell boundary 401-2 of the circuit cell 402-2). The isolation transistors NI1, NI2, NI3, PI1, PI2, and PI3 isolate the circuit cell 402-1, the circuit cell 402-2, other circuit cell, and other devices (not shown) from each other.

As shown in FIG. 4C, the gate structures 406 each include a gate dielectric layer 412 and a gate electrode 414, in which the gate dielectric layer 412 wraps around the nanostructures 416 and the gate electrode 414 wraps around the gate dielectric layer 412. The material of the gate dielectric layer 412 and the gate electrode 414 are similar to that of the gate dielectric layer 110 and gate electrode 112 discussed above. As shown in FIGS. 4A and 4B, the gate structures 406 extend in the Y-direction. In some embodiments, each of the gate structures 406-3, 406-4, and 406-7 is shared by one N-type transistor and one P-type transistor. For example, the gate structure 406-3 is shared by the transistors NT1 and PT1. Therefore, in some embodiments, the gate structures 406-3, 406-4, and 406-7 are also referred to as common gates. In some aspects, the gate structures 406 of the transistors NT1, NT2, and NT3 respectively align (or connect) to the gate structures 406 of the transistors PT1, PT2, and PT3. The gate structures 406 have a gate length in the X-direction and are in a range from about 6 nm to about 20 nm.

As shown in FIGS. 4C, 4D, 4G, and 4H, the gate top dielectric layers 422 are over the gate structures 406, gate spacers 408, and nanostructures 416, and the material of the gate top dielectric layers 422 is similar to that of the gate top dielectric layer 116 discussed above.

Gate spacers 408 are on sidewalls of the gate structures 406, as shown in FIGS. 4G and 4H. The gate spacers 408 may include a dielectric material as that of the gate spacers 114 discussed above. The gate spacers 408 are over the nanostructures 416 and on top sidewalls of the gate structures 406, and thus are also referred to as gate top spacers or top spacers. Inner spacers 420 are between the nanostructures 416, as shown in FIG. 4G. The inner spacers 420 may include a dielectric material having higher K value (dielectric constant) than the gate spacers 408 and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), air gap, or a combination thereof. In some embodiments, the gate spacers 408 and the inner spacers 420 have a thickness in the X-direction and in a range from about 4 nm to about 12 nm.

As shown in FIGS. 4A and 4B, gate end dielectrics 410 are at ends of the gate structures 406. The gate end dielectrics 410 are used for separating the gate structures 406. For example, the gate end dielectrics 410 separate the gate structures 406-3, 406-4, and 406-7 from gate structures of other circuit cells (not shown). In some embodiments, the gate structures 406 of the isolation transistors NI1, NI2, and NI3 are respectively separated from the gate structures 406 of the isolation transistors PI1, PI2, and PI3 by the gate end dielectrics 410, as shown in FIGS. 4A and 4D. The material of the gate end dielectrics 410 is selected from a group consisting of $Si_3N_4$, nitride-base dielectric, carbon-base dielectric, high K material ($K>=9$), or a combination thereof.

The nanostructures 416 are similar to the nanostructures 120 discussed above. The nanostructures 416 are wrapped by the gate structures 406 to serve as channels or channel layers of the transistors NT1, NT2, NT3, PT1, PT2, and PT3 and the isolation transistors NI1, NI2, NI3, PI1, PI2, and PI3. As shown in FIGS. 4G and 4H, each of the transistors NT1, NT2, NT3, PT1, PT2, and PT3 and the isolation transistors NI1, NI2, NI3, PI1, PI2, and PI3 has three nanostructures 416 vertically arranged (or stacked) in the Z-direction. It should be noted that three nanostructures 416 of each transistor are for illustrative purposes only and not intended to be limiting beyond what is specifically recited in the claims. The number of the nanostructures 416 for each transistor depends on the desired number of channels members for the transistor. In some embodiments, there may be from 2 to 6 nanostructures 416 in each transistor. In some embodiments, the nanostructures 416 has a channel width W in the Y-direction and in a range from about 4 nm to about 70 nm, a thickness T in the Z-direction and in a range from about 4 nm to about 8 nm, a space distance S in the Z-direction and in a range from about 6 nm to about 15 nm, and a vertical pitch P in the Z-direction and in a range from about 10 nm to about 23 nm, as shown in FIG. 4D.

The source/drain features 418 each are between two gate structures 406 and connect (or contact) the nanostructures 416 of the transistors, as shown in FIG. 4G. Therefore, the source/drain features 418 each are shared by two gate structures 406. In some embodiments, the source/drain features 418 may be also referred to as common source/drain features. The material of the source/drain features 418 are similar to that of the epitaxially-grown materials 118 discussed above.

In general, the gate structures and the nanostructures of the isolation transistors are removed and replaced with dielectric material for electrical isolation. In some embodiments, the gate structures 406 and the nanostructures 416 of the isolation transistors NI1, NI2, NI3, PI1, PI2, and PI3 remain. Therefore, the nanostructures 416 of the isolation transistors NI1, NI2, NI3, PI1, PI2, and PI3 connect (or contact) the source/drain features 418 of the adjacent transistors, such that the active areas 404 constructed by the nanostructures 416 and source/drain features 418 remains continuity. Such continuous active areas increase the stress of the channel of the transistors to improve transistor performance. More specifically, the nanostructures 416 and source/drain features 418 of the transistors NT1, NT2, and NT3 and the nanostructures 416 of the isolation transistors NI1, NI2, and NI3 are connected with each other to construct the continuous active area 404-1. The nanostructures 416 and source/drain features 418 of the transistors PT1, PT2, and PT3 and the nanostructures 416 of the isolation transistors PI1, PI2, and PI3 are connected with each other to construct the continuous active area 404-2. In some embodiments, each active area 404 extends across at least four circuit cells abutted together.

As discussed above, the front side interconnect structure is over the device region or at the front side of the device region. The front side interconnect structure of the semiconductor device 400 includes source/drain contacts 502 (including source/drain contacts 502-1 to 502-4), vias 504 (including vias 504-1 to 504-3), metal lines 506 (including metal lines 506-1 to 506-6), vias 508 (including vias 508-1 to 508-4), metal lines 510 (including metal lines 510-1 to 510-5), gate vias 512 (including gate vias 512-1 to 512-3), inter-layer dielectric (ILD) 514, and IMD 516, which are over (or at the front side of) the transistors NT1, NT2, NT3, PT1, PT2, and PT3 and isolation transistors NI1, NI2, NI3, PI1, PI2, and PI3.

The vias 504, the metal lines 506, the vias 508, the metal lines 510, and the gate vias 512 may be respectively similar to the vias V0, the metal lines M1, the vias V1, the metal lines M2, and the via F_VG discussed above. The source/drain contacts 502, the vias 504 and 508, the gate vias 512, the metal lines 506 and 510, the ILD 514, and IMD 516 may also be referred to as the front side source/drain contacts, the front side vias, the front side gate vias, the front side metal lines, the front side ILD, and the front side IMD, respectively.

As shown in FIG. 4A, the source/drain contacts 502 extend in the Y-direction and are between the gate structures 406, the metal lines 506 extend in the X-direction, and the metal lines 510 extend in the Y-direction and are between the gate structures 406. The source/drain contacts 502 are over and contact (or connect) the source/drain features 418, as shown in FIGS. 4E to 4G. In some embodiments, the vias 504 and 508 and the gate vias 512 may have circular shape in the top view. In other embodiments, the vias 504 and 508 and the gate vias 512 may have a rectangular shape in the top view.

The semiconductor device 400 further includes silicide features 501 between the source/drain contacts 502 and the source/drain features 418, as shown in FIGS. 4E to 4G. The silicide features 501 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

The source/drain contact 502-1, the via 504-1, the metal lines 506-2 and 506-4, the vias 508-1 and 508-2, the metal lines 510-1 and 510-2, and the gate via 512-1 are used for connections of the circuit cell 402-2 (including the inverter). As shown in FIGS. 4A to 4H, the gate via 512-1 connects the source/drain contact 406-7 to the metal line 506-2, and the via 508-2 connects the metal line 506-2 to the metal line 510-2. The via 504-1 connects the source/drain contact 502-1 to the metal line 506-4, and the via 508-1 connects the metal line via 506-4 to the metal line 510-1.

The source/drain contacts 502-2 to 502-4, the via 504-2 and 504-3, the metal lines 506-1, 506-3, 506-5, and 506-6, the vias 508-3 and 508-4, the metal line 510-4, and the gate vias 512-2 and 512-3 are used for connections of the circuit cell 402-1 (including the NAND). As shown in FIGS. 4A to 4H, the gate via 512-2 connects the source/drain contact 406-4 to the metal line 506-6, and the gate via 512-3 connects the source/drain contact 406-3 to the metal line 506-3. The source/drain contact 502-2 couples to the source/drain contact 502-4 through the via 504-2, the metal line 506-1, the via 508-3, the metal line 510-4, the via 508-4, the metal line 506-5, and the via 504-3.

As discussed above, the back side interconnect structure is under the device region or at the back side of the device region. Referring to FIG. 4B, the back side interconnect structure of the semiconductor device 400 includes source/drain contacts 602 (including source/drain contacts 602-1 to 602-5), vias 604 (including vias 604-1 to 604-5), gate vias 606 (including gate vias 606-1 to 606-6), metal lines 608 (including metal lines 608-1 and 608-2), dielectric 610 (shown in FIGS. 4C to 4H), and IMD 612 (shown in FIGS. 4C to 4H), which are under (or at the back side of) the transistors NT1, NT2, NT3, PT1, PT2, and PT3 and isolation transistors NI1, NI2, NI3, PI1, PI2, and PI3.

The vias 604, gate vias 606, and the metal lines 608 may be respectively similar to the via B_V0, the vias B_VG, and the metal lines B_M1 discussed above. The source/drain contacts 602, the vias 604, the gate vias 606, the metal lines 608, dielectric 610, and IMD 612 may also be referred to as the back side source/drain contacts, the back side vias, the back side gate vias, the back side metal lines, the back side dielectric layer, and the back side IMD, respectively.

As shown in FIG. 4B, the source/drain contacts 602 extend in the Y-direction and are between the gate structures 406, and the metal lines 608 extend in the X-direction. As shown in FIGS. 4F to 4H, the source/drain contacts 602 are under and contact (or connect) the source/drain features 418. In some embodiments, the vias 604 and the gate vias 606 may have a circular shape in the top view. In other embodiments, the vias 604 and the gate vias 606 may have a rectangular shape in the top view.

The back side interconnect structure of the semiconductor device 400 are used for providing voltage to the circuit cells 402-1 and 402-2. In some embodiments, the metal lines 608-1 and 608-2 are respectively connected to a VSS voltage source and a VDD voltage source (not shown). Therefore, the metal line 608-1 may be also referred to as the (back side) VSS voltage metal line, the (back side) VSS voltage line, or (back side) VSS voltage conductor, and the metal line 608-2 may be also referred to as the (back side) VDD voltage metal line, the (back side) VDD voltage line, or (back side) VDD voltage conductor.

The source/drain contacts 602-1 and 602-2, and the via 604-1 and 604-2 are used for the circuit cell 402-2 (including the inverter). As shown in FIGS. 4A to 4H, the source/drain contact 602-1 is under and contact (or connect to) the source/drain feature 418 of the transistor NT3, and the via 604-1 connect the source/drain contact 602-1 to the metal line 608-1. The source/drain contact 602-2 is under and contact (or connect to) the source/drain feature 418 of the transistor PT3, and the via 604-2 connects the source/drain contact 602-2 to the metal line 608-2. Therefore, VSS voltage is supplied to the source/drain feature 418 of the transistor NT3, similar to the N-type transistor N1 discussed above, and VDD voltage is supplied to the source/drain feature 418 of the transistor PT3, similar to the P-type transistor P1 discussed above.

The source/drain contacts 602-3 to 602-5, and the via 604-3 to 604-5 are used for the circuit cell 402-1 (including the NAND). As shown in FIGS. 4A to 4H, the source/drain contact 602-4 is under and contact (or connect to) the source/drain feature 418 of the transistor NT1, and the via 604-4 connects the source/drain contact 602-4 to the metal line 608-1. The source/drain contact 602-3 is under and contact (or connect to) the source/drain feature 418 of the transistor PT2, and the via 604-3 connects the source/drain contact 602-3 to the metal line 608-2. The source/drain contact 602-5 is under and contact (or connect to) the source/drain feature 418 of the transistor PT1, and the via 604-5 connects the source/drain contact 602-5 to the metal line 608-2. Therefore, VSS voltage is supplied to the source/drain features 418 of the transistor NT1, similar to the N-type transistor N3 discussed above, and VDD voltage is supplied to the source/drain features 418 of the transistor PT1 and PT2, similar to P-type transistor P3 and P2 discussed above.

As discussed above, the isolation transistors NI1, NI2, NI3, PI1, PI2, and PI3 each have nanostructures 416 and gate structures 406. The isolation transistors NI1, NI2, NI3, PI1, PI2, and PI3 should be turned off for isolating the circuit cells from each other. The gate vias 606-1, 606-3, and 606-5 pass through the dielectric 610 to respectively connect the gate structures 406 of the isolation transistors NI1, NI2, and NI3 to the metal line 608-1 (VSS voltage), thereby turning off the isolation transistors NI1, NI2, and NI3. The gate vias 606-2, 606-4, and 606-6 respectively connect (or contact) the gate structures 406 (more specifically, the gate electrodes 414) of the isolation transistors PI1, PI2, and PI3 to the metal line 608-2 (VDD voltage), thereby turning off the isolation transistors PI1, PI2, and PI3. The gate vias 606 are also referred to as gate connections for connecting the gate structures of the isolation transistors to the metal lines.

The ILD 514, the IMD 516, the dielectric 610, and the IMD 612 each may include one or more dielectric layers including dielectric materials, such as tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or a combination thereof.

The materials of the source/drain contacts 502, the vias 504, the metal lines 506, the vias 508, the metal lines 510, the gate vias 512, the source/drain contacts 602, the vias 604, the gate vias 606, and the metal lines 608 are selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof.

In some embodiments, the semiconductor device 400 further includes an isolation feature 424. The isolation feature 424 is between the source/drain features 418 and between the gate structures 406, as shown in FIGS. 4E, 4F and 4H. The isolation feature 424 is similar to the isolation feature 104 discussed above.

Figure 5A:
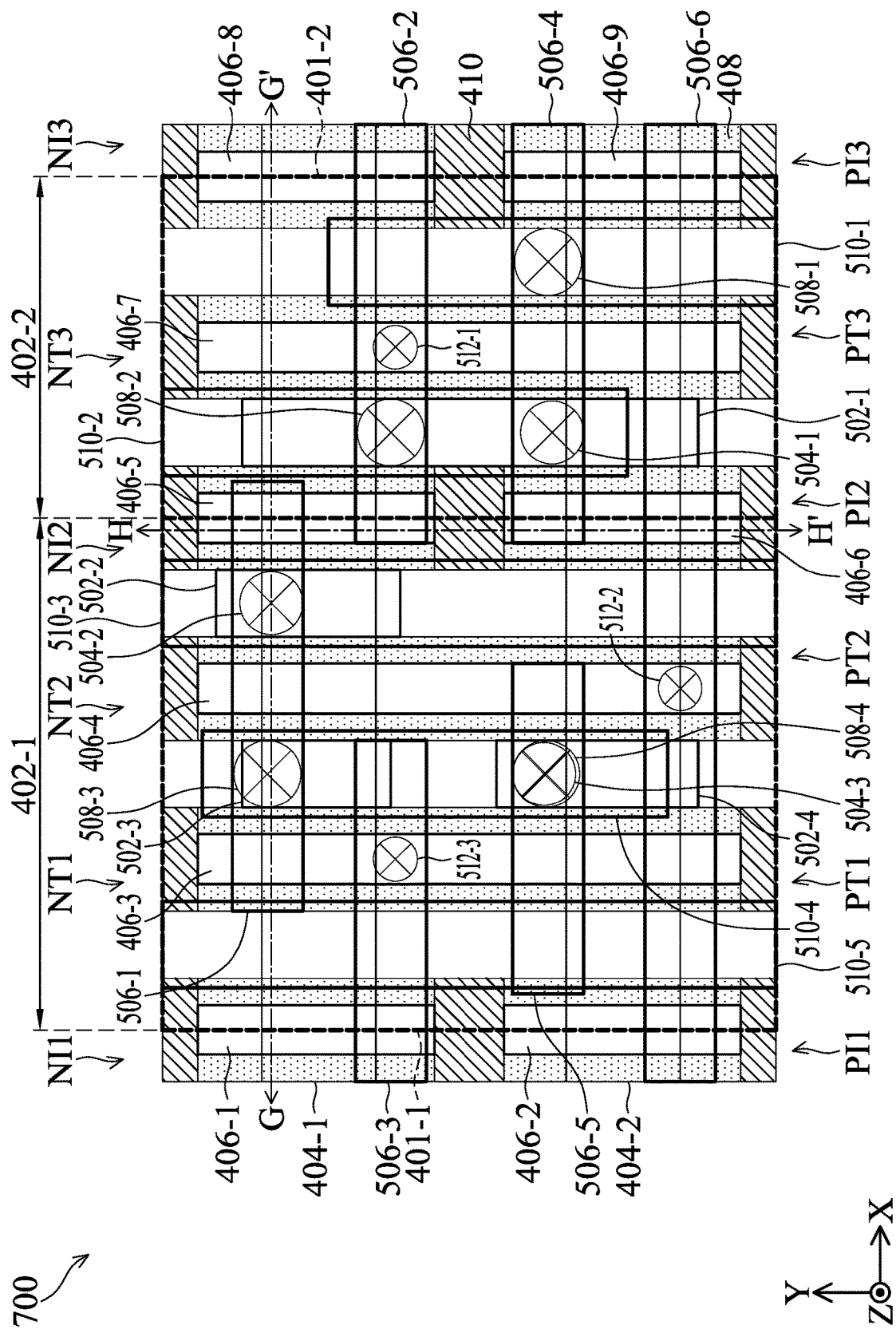
Figure 5B:
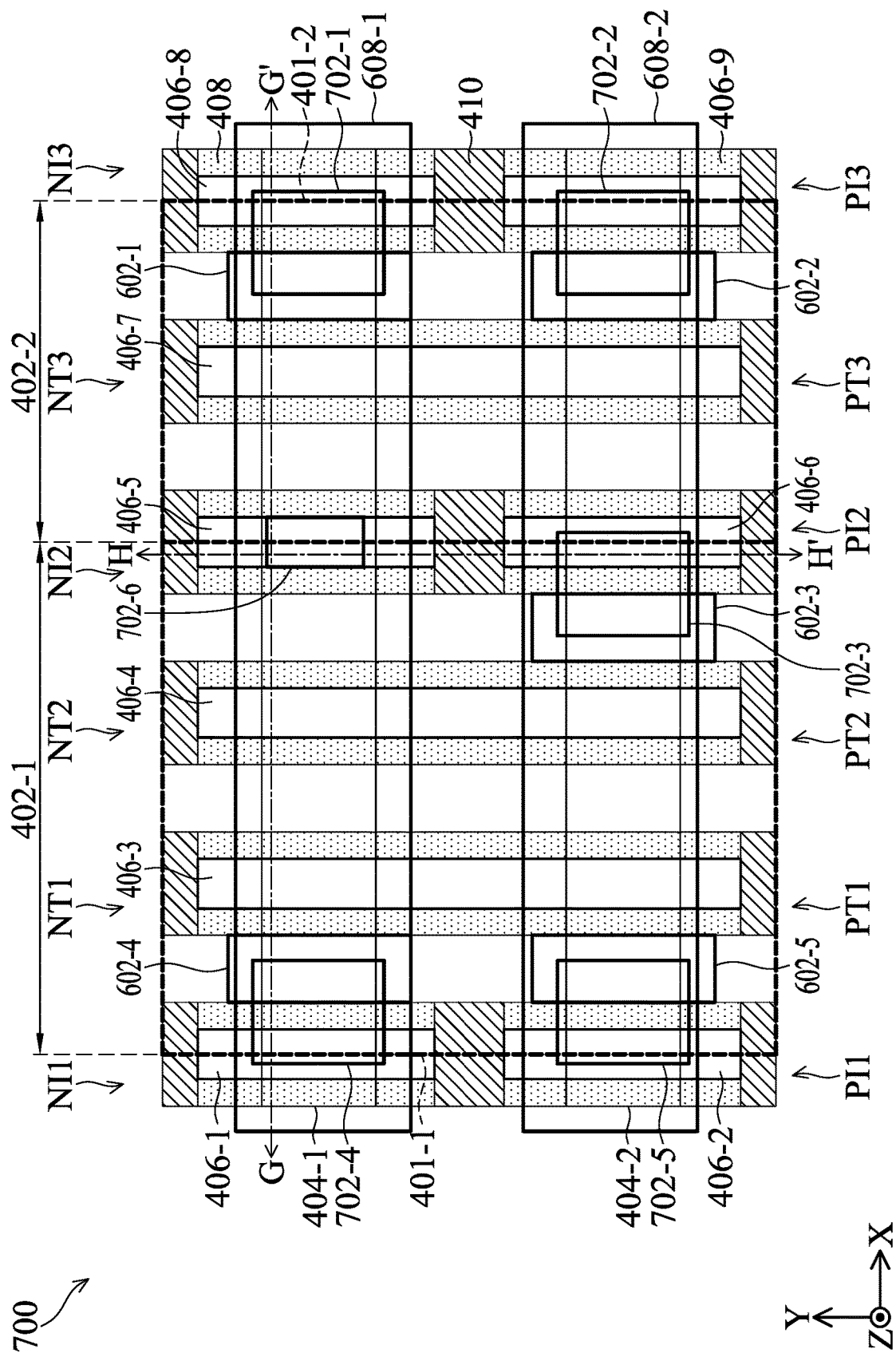
Figure 5C:
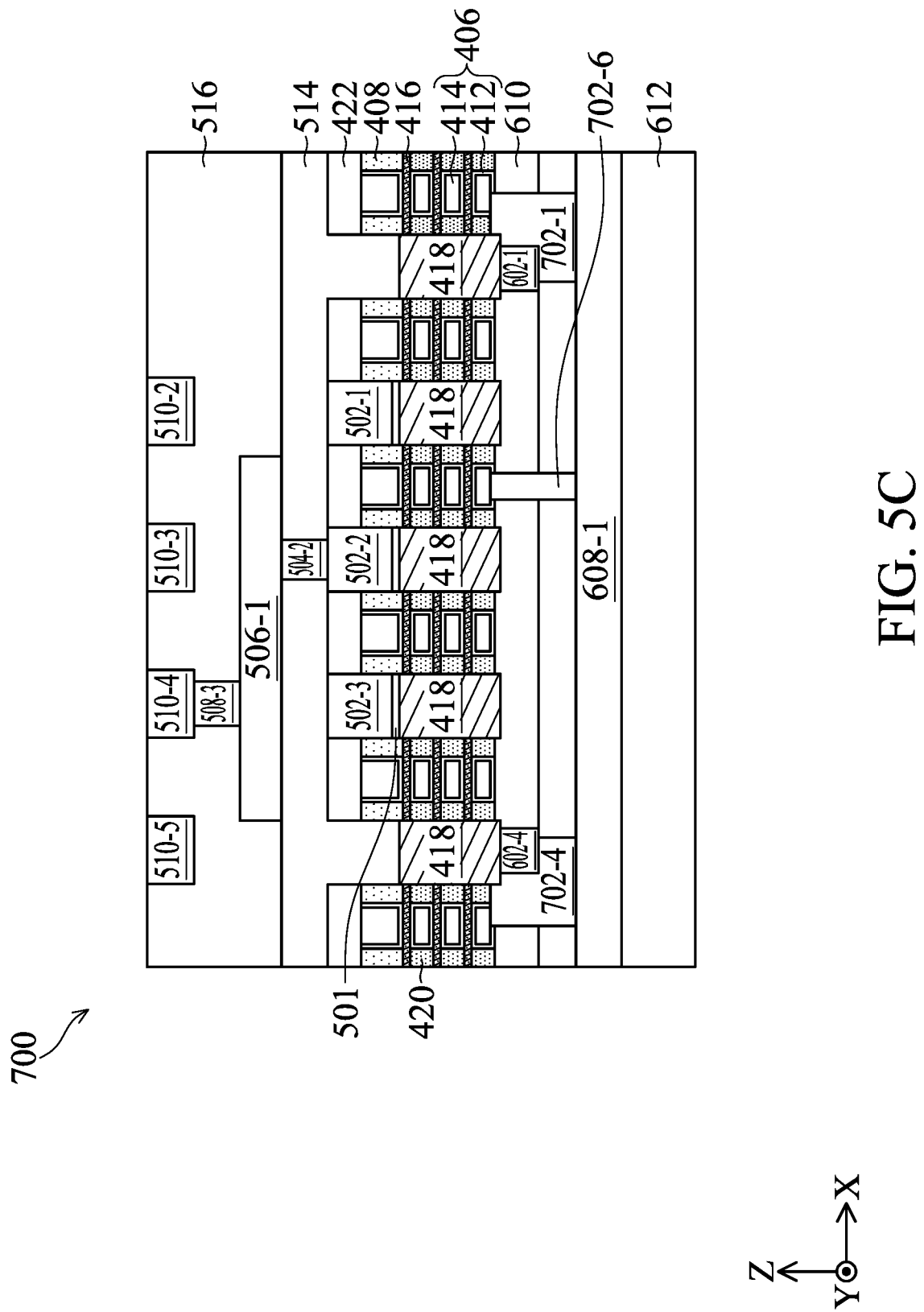
FIG. 5C illustrates a cross sectional view of an embodiment of the semiconductor device along a line G-G' in FIGS. 5A and 5B, in accordance with some embodiments.
Figure 5D:
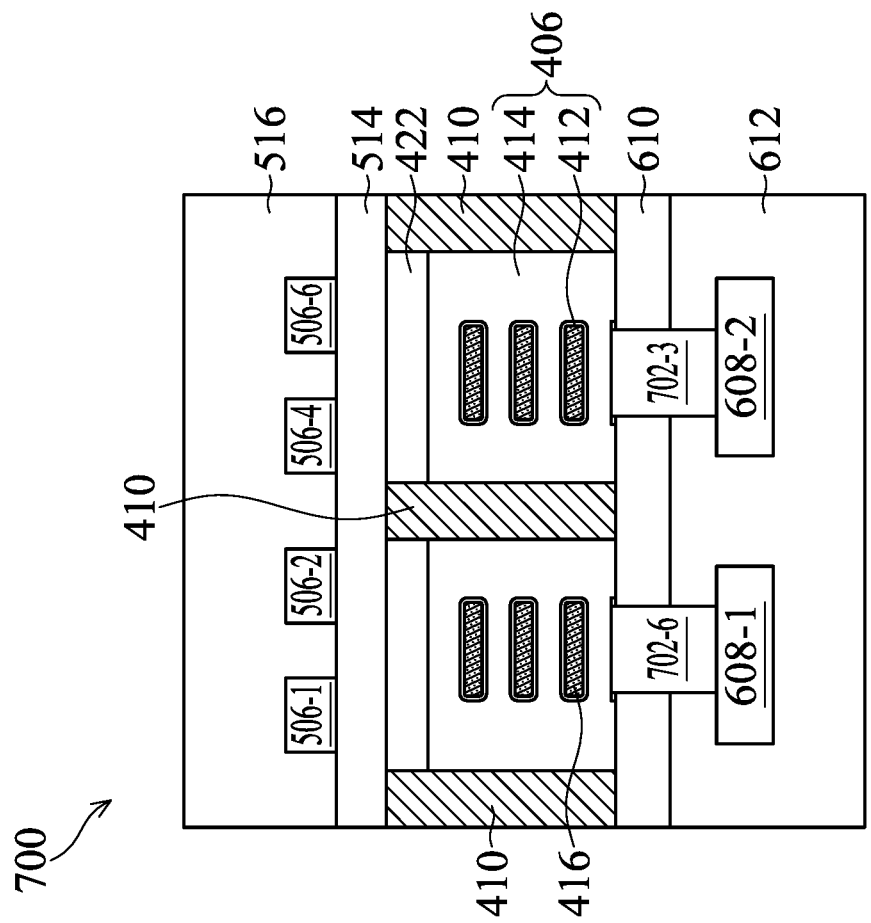
FIG. 5D illustrates a cross sectional view of an embodiment of the semiconductor device along a line H-H' in FIGS. 5A and 5B, in accordance with some embodiments.

FIGS. 5A and 5B illustrate top views (or layouts) of an embodiment of a semiconductor device 700 of the present disclosure, in accordance with some embodiments. FIG. 5A illustrates the features in the device region (including transistors) and the front side interconnect structure (including vias and metal lines), and FIG. 5B illustrates the features in the device region and the back side interconnect structure. FIG. 5C illustrates a cross sectional view of an embodiment of the semiconductor device 700 along a line G-G' in FIGS. 5A and 5B, in accordance with some embodiments. FIG. 5D illustrates a cross sectional view of an embodiment of the semiconductor device 700 along a line H-H' in FIGS. 5A and 5B, in accordance with some embodiments.

The semiconductor device 700 is similar to the semiconductor device 400 discussed above, except that butt vias 702 (including butt vias 702-1 to 702-6) replace the vias 604 and the gate vias 606. As shown in FIG. 5B, the butt vias 702 have a rectangular shape in the top view. The butt vias 702 passes through the dielectric 610 to connect the gate structure 406 of the isolation transistor and the source/drain contact 602 of the adjacent transistor to the metal lines 608. For example, as shown in FIGS. 5B and 5C, butt via 702-1 connect the gate structure 406 of the isolation transistor NI3 and the source/drain contact 602-1 (which connects to the source/drain feature 418 of the transistor NT3) to the metal line 608-1 (VSS voltage), such that the VSS voltage is supplied to the source/drain feature 418 of the transistor NT3 and the isolation transistor NI3 is turned off. In the case where the source/drain features 418 adjacent to the isolation transistor do not need to be connected to the VSS voltage, the butt via 702 directly connect the isolation transistor to the metal line 608-1 (VSS voltage), as the butt via 702-6 shown in the FIGS. 5B and 5C. In some embodiments, the source/drain contacts 602 and butt vias 702 are collectively referred to as gate connections for connecting the gate structures of the isolation transistors to the metal lines. In some embodiments, the source/drain contacts 602 may be omitted and the butt via 702 directly connects the gate structure 406 of the isolation transistor and the source/drain feature 418 of the adjacent transistor to the metal line 608.

Figure 6A:
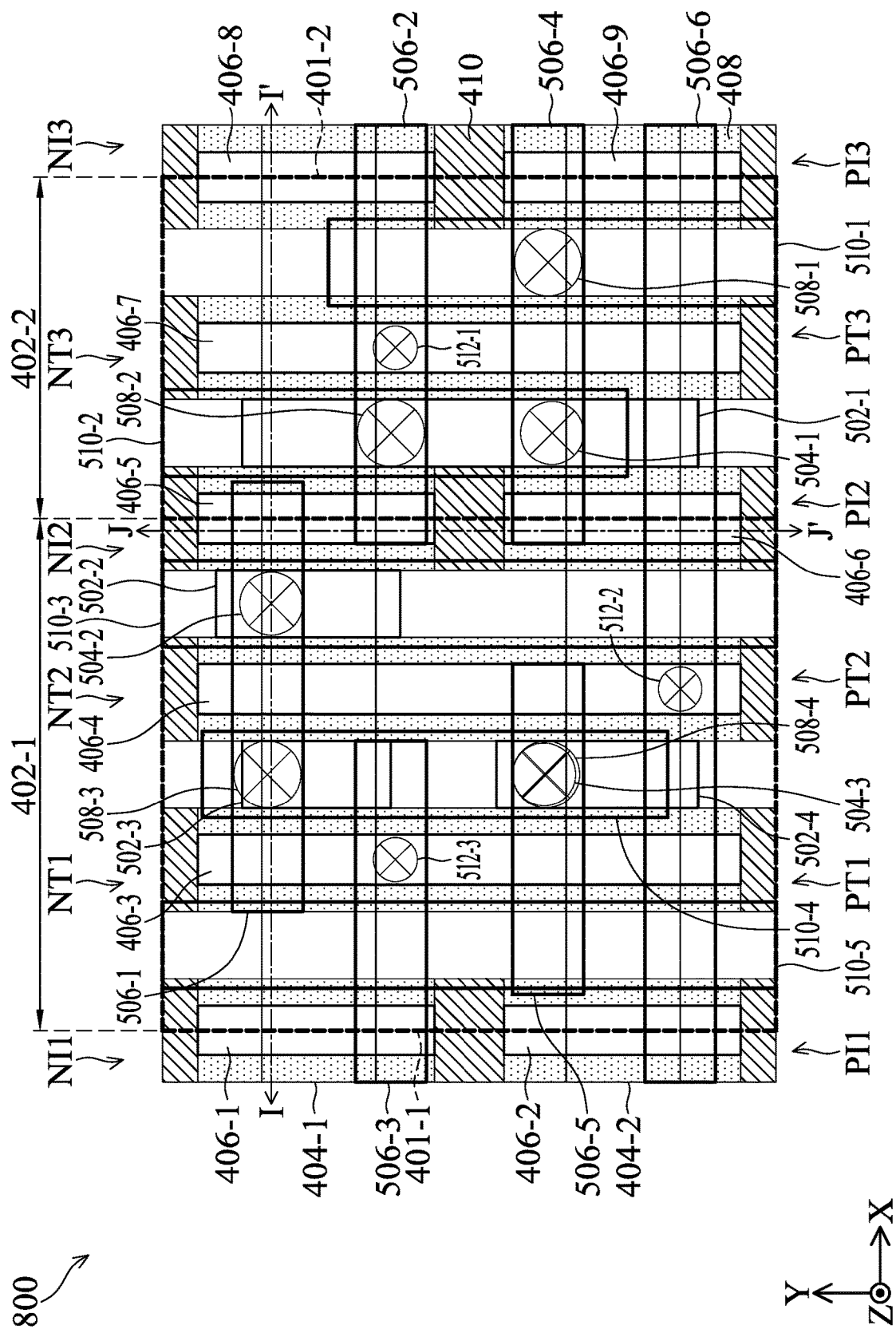
Figure 6B:
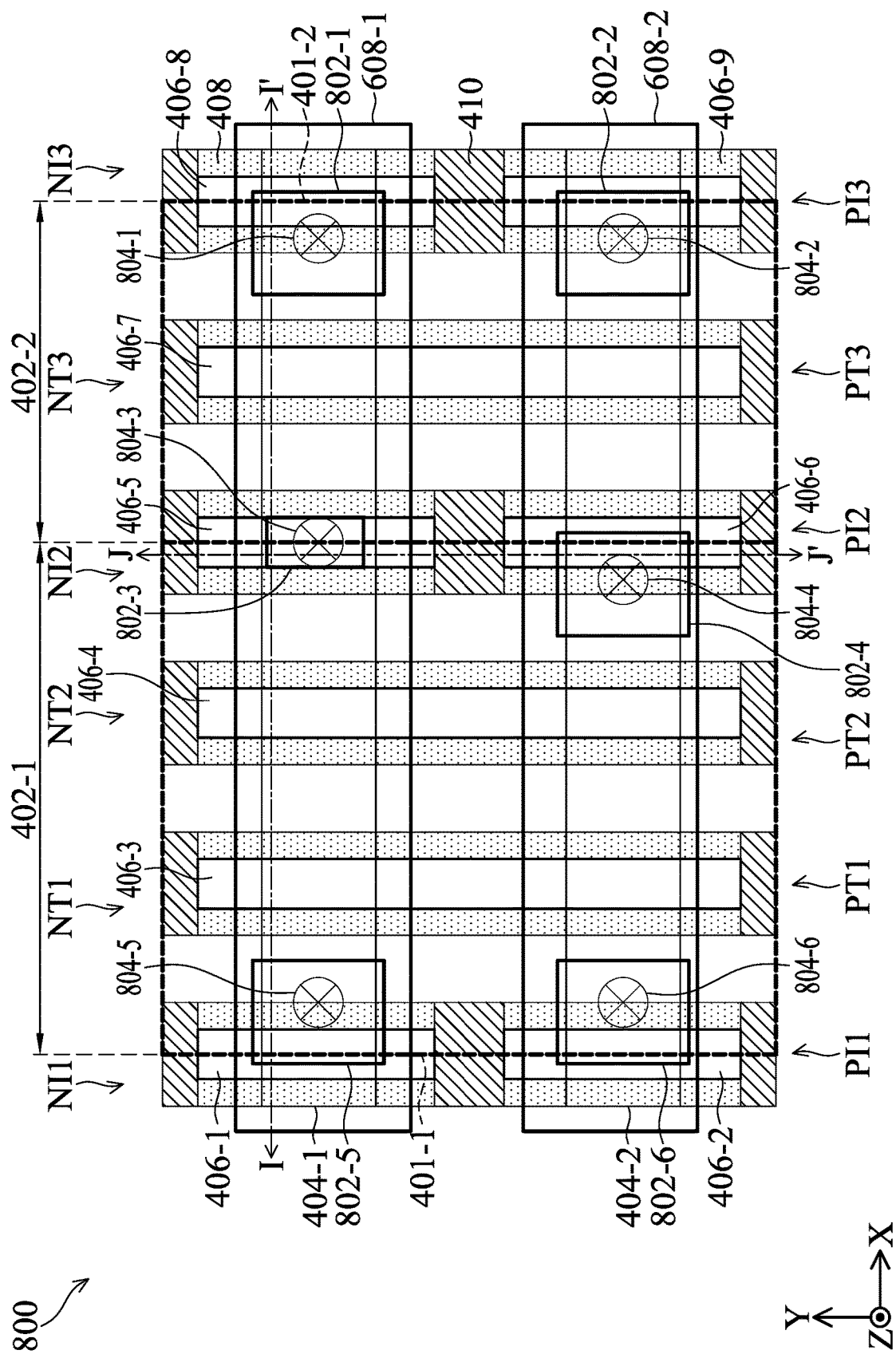
Figure 6C:
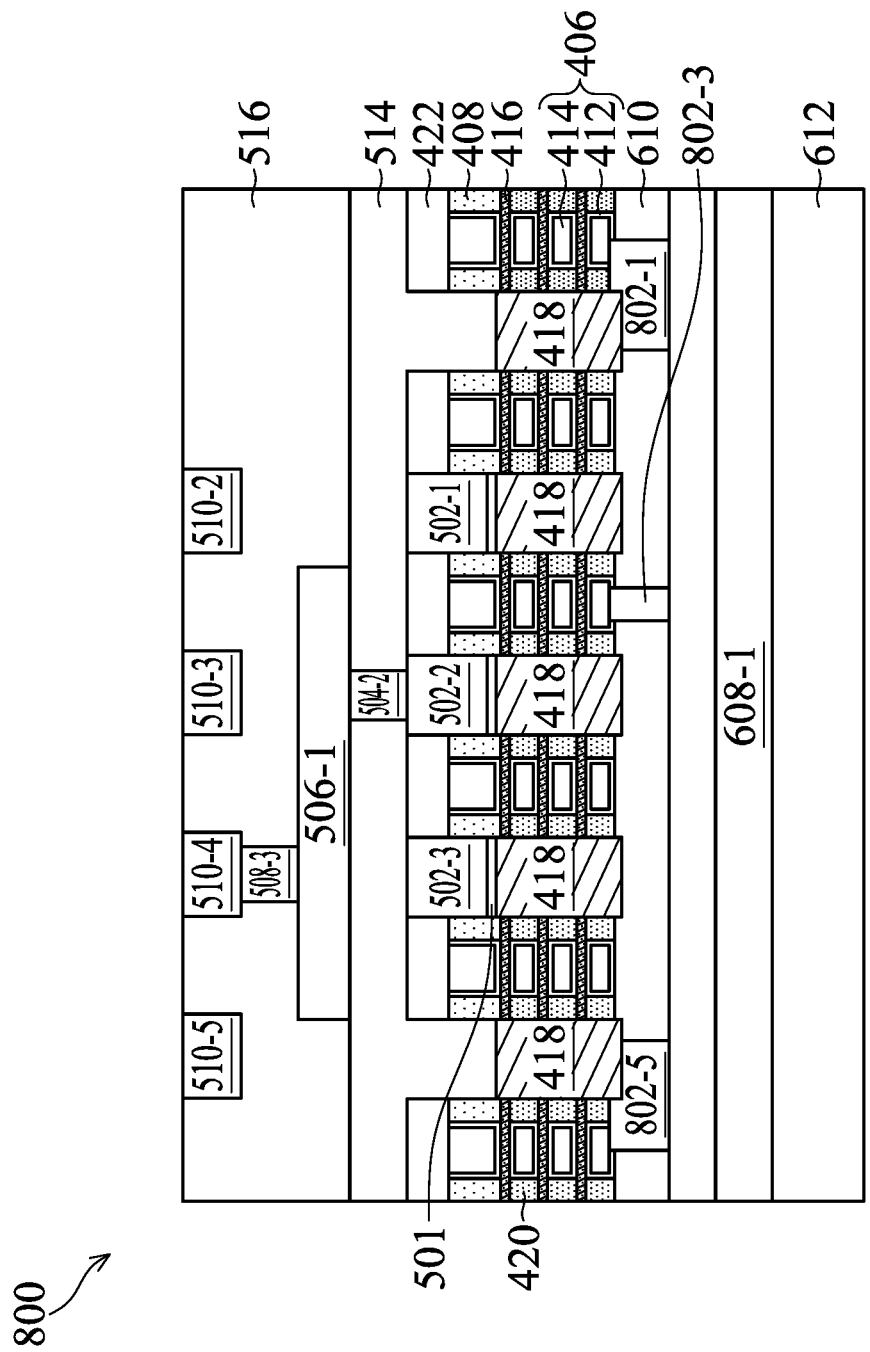
FIG. 6C illustrates a cross sectional view of an embodiment of the semiconductor device along a line I-I' in FIGS. 6A and 6B, in accordance with some embodiments.
Figure 6D:
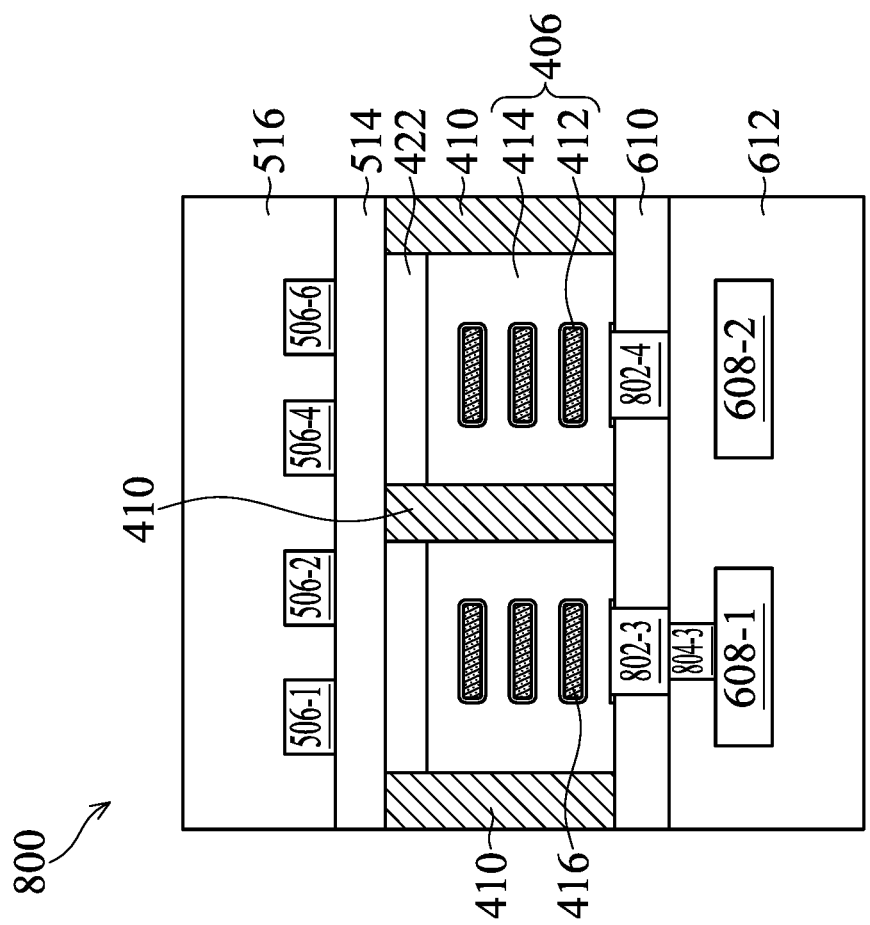
FIG. 6D illustrates a cross sectional view of an embodiment of the semiconductor device along a line J-J' in FIGS. 6A and 6B, in accordance with some embodiments.

FIGS. 6A and 6B illustrate top views (or layouts) of an embodiment of a semiconductor device 800 of the present disclosure, in accordance with some embodiments. FIG. 6A illustrates the features in the device region (including transistors) and the front side interconnect structure (including vias and metal lines), and FIG. 6B illustrates the features in the device region and the back side interconnect structure. FIG. 6C illustrates a cross sectional view of an embodiment of the semiconductor device 800 along a line I-I' in FIGS. 6A and 6B, in accordance with some embodiments. FIG. 6D illustrates a cross sectional view of an embodiment of the semiconductor device 800 along a line J-J' in FIGS. 6A and 6B, in accordance with some embodiments.

The semiconductor device 800 is similar to the semiconductor device 400 discussed above, except that butt contacts 802 (including butt contacts 802-1 to 802-6) and vias 804 (including vias 804-1 to 804-6) replace the source/drain contacts 602, the vias 604, and the gate vias 606. As shown in FIG. 6B, the butt contacts 802 have a rectangular shape in the top view, and the vias 804 have a circular shape in the top view. The butt contacts 802 are under the source/drain features 418, the transistors, and the isolation transistors, as shown in FIGS. 6B to 6D. The butt contacts 802 connect the source/drain contact 418 of the transistor to the gate structure 406 of the adjacent isolation transistor, and the vias 804 connect the butt contacts 802 to the metal line 608.

For example, as shown in FIGS. 6B and 6C, the butt contact 802-1 connects the source/drain feature 418 of the transistor NT3 to the gate structure 406 of the isolation transistor NI3, and the via 804-1 connects the butt contact 802-1 to the metal line 608-1 (VSS voltage), such that the VSS voltage is supplied to the source/drain feature 418 of the transistor NT3 and the isolation transistor NI3 is turned off. In the case where the source/drain features 418 adjacent to the isolation transistor do not need to be connected to the VSS voltage, the butt contact 802 and the via 804 directly connect the isolation transistor to the metal line 608-1 (VSS voltage), as the butt contact 802-3 and the via 804-3 shown in the FIGS. 6B and 6D. In some embodiments, the butt contacts 802 and the vias 804 are collectively referred to as gate connections for connecting the gate structures of the isolation transistors to the metal lines.

Figure 7A:
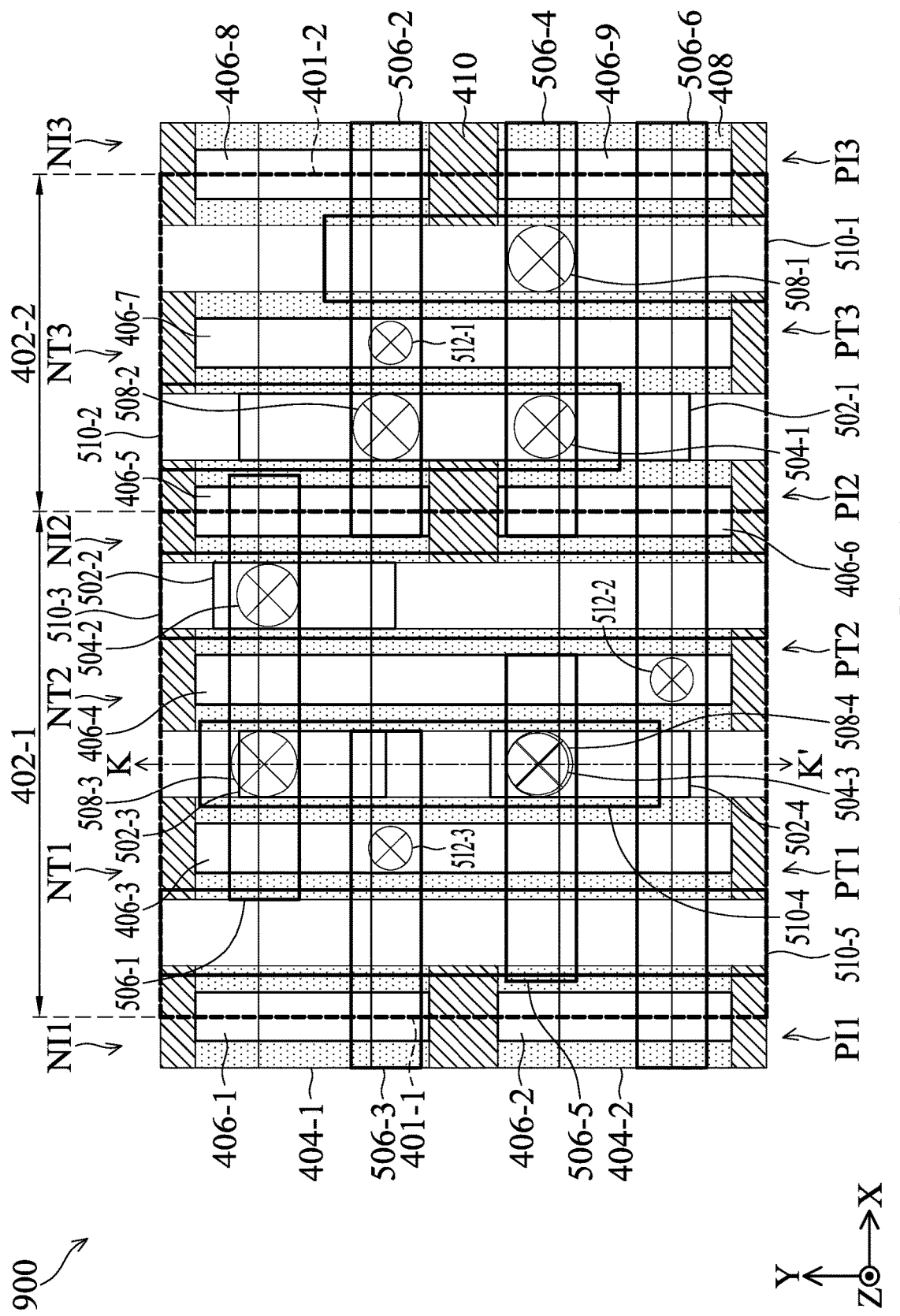
Figure 7B:
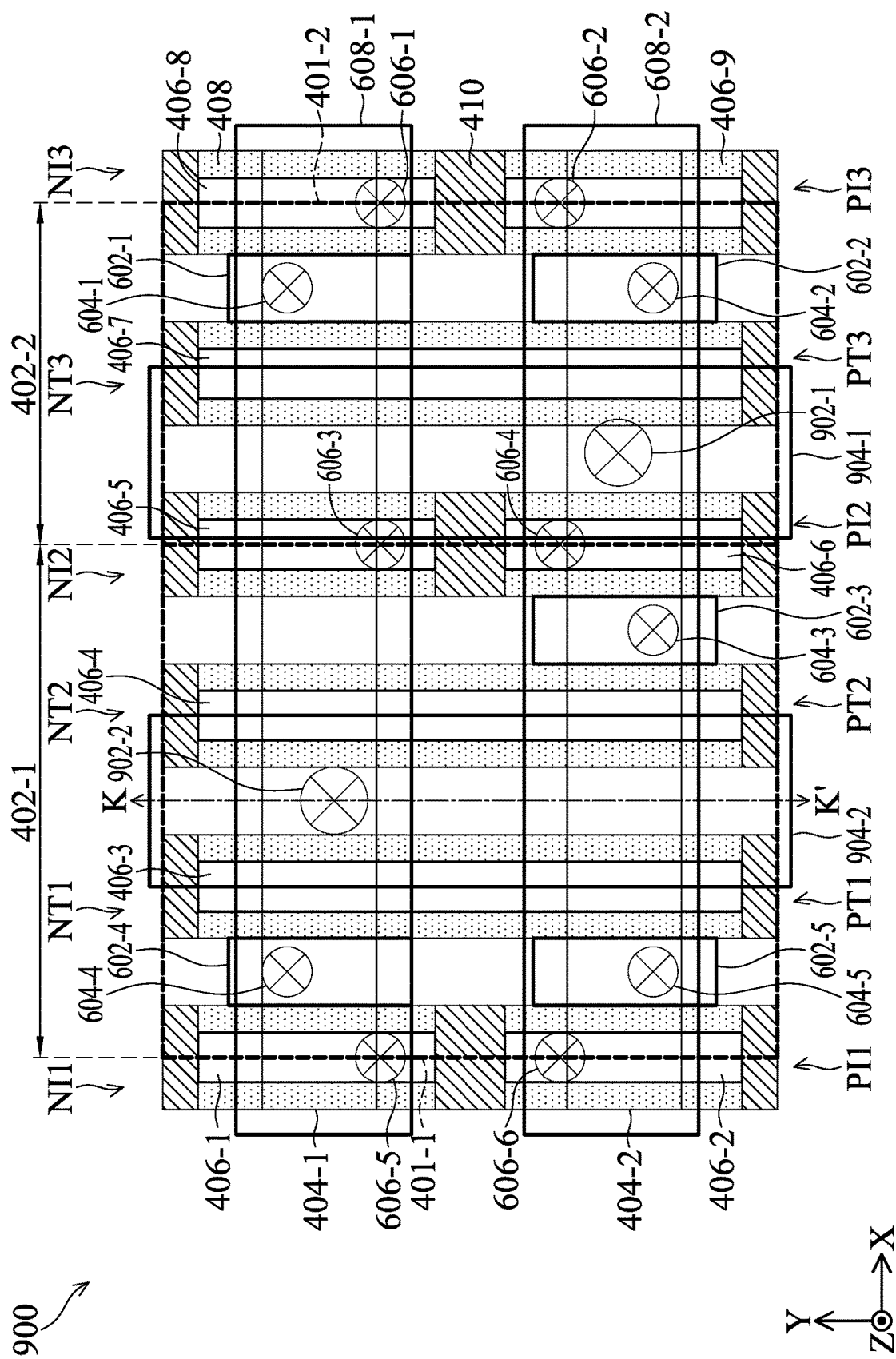
Figure 7C:
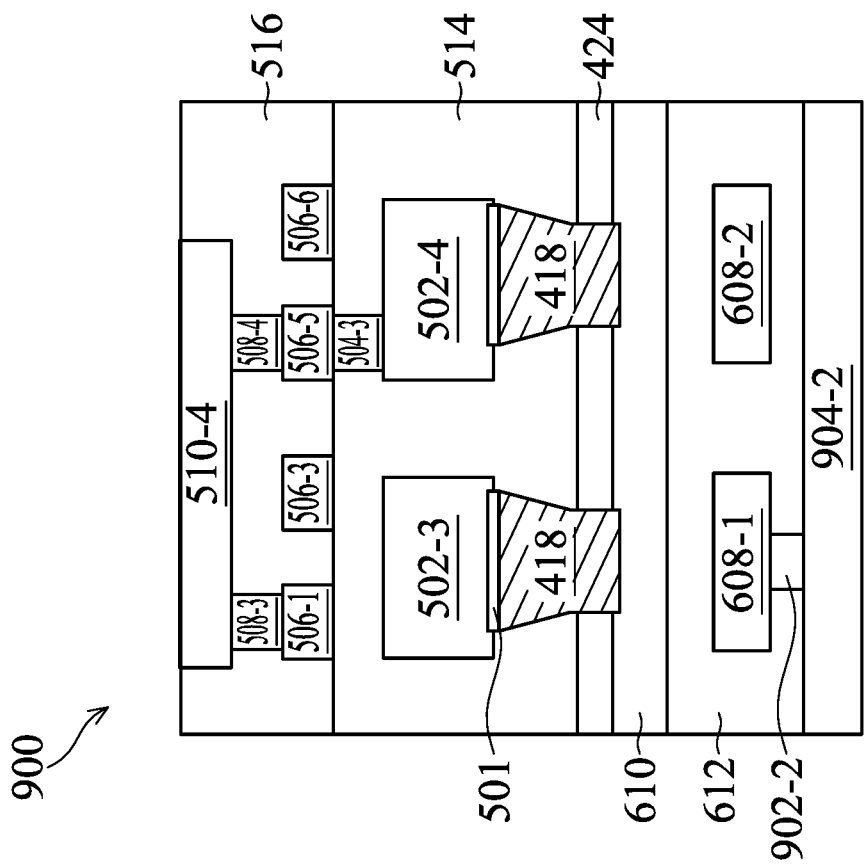
FIG. 7C illustrates a cross sectional view of an embodiment of the semiconductor device along a line K-K' in FIGS. 7A and 7B, in accordance with some embodiments.

FIGS. 7A and 7B illustrate top views (or layouts) of an embodiment of a semiconductor device 900 of the present disclosure, in accordance with some embodiments. FIG. 7A illustrates the features in the device region (including transistors) and the front side interconnect structure (including vias and metal lines), and FIG. 7B illustrates the features in the device region and the back side interconnect structure. FIG. 7C illustrates a cross sectional view of an embodiment of the semiconductor device 900 along a line K-K' in FIGS. 7A and 7B, in accordance with some embodiments.

The semiconductor device 900 is similar to the semiconductor device 400 discussed above, except that the semiconductor device 700 further includes vias 902 and metal lines 904. The vias 902 and metal lines 904 may be respectively similar to the via B_V1 and the metal line B_M2 discussed above. As shown in FIGS. 4B and 7C, the metal lines 904 extend in the Y-direction and are under the metal lines 608. The vias 902 connect the metal lines 608 to the metal lines 904, as shown in FIGS. 7B and 7C. In this embodiment, the metal lines 904-2 and 904-1 are respectively connected to a VSS voltage source and a VDD voltage source (not shown). Therefore, the metal line 904-1 may be also referred to as the (back side) VDD voltage metal line, the (back side) VDD voltage line, or (back side) VDD voltage conductor, and the metal line 904-2 may be also referred to as the (back side) VSS voltage metal line, the (back side) VSS voltage line, or (back side) VSS voltage conductor.

As discussed above, the metal lines 608 (or metal lines 904, if present) are connected to voltage sources to serve as voltage line or voltage conductor. In some embodiments, the metal lines 608 continuously extend in the X-direction, and will be connected to voltage sources in an area other than the area where circuit cells 402 are located. FIGS. 8A to 8C illustrate cross sectional views of an embodiment of connection structures 1000A to 1000C for connecting the voltage line from the back side to voltage source at the front side, in accordance with some embodiments. As shown in FIG. 8A, a tap structure 1016 may connect a voltage line 1002 to a voltage source 1018 (VDD or VSS). The voltage line 1002 may be the metal line 608 discussed above. The tap structure 1016 may include a via 1004, a contact feature 1006, a tap via 1008, a contact feature 1010, a via 1012, and a metal line 1014. The voltage source 1018 is over the circuit cells as discussed above or the metal line 1014. The via 1004 and the contact feature 1006 are at the back side of the device region discussed above, and the via 1012 and the contact feature 1010 are at the front side of the device region. In some embodiments, the via 1004 and the vias 604 are formed at the same fabrication operation, the contact feature 1006 and the source/drain contacts 602 are formed at the same fabrication operation, the contact feature 1010 and the source/drain contacts 502 are formed at the same fabrication operation, and the via 1012 and the via 504 are formed at the same fabrication operation. In some embodiments, the tap via 1008 is formed after the formation of the gate vias 606. It should be noted that tap structure 1016 may have more vias and more metal lines over the 1014 for connecting the voltage line 1002 to the voltage source 1018. The connection structure 1000B is similar to the connection structure 1000A, except that the contact feature 1006 is omitted. The 1008 connect the via 1004 to the contact feature 1010. The connection structure 1000C is similar to the connection structure 1000A, except that the contact features 1006 and 1010 are omitted. The tap via 1008 connects the via 1004 to the via 1012.

The embodiments disclosed herein relate to semiconductor devices, and more particularly to semiconductor devices including circuit cells, in which the circuit cells have continuous active areas including source/drain features and channels of the functional transistors and channels of the isolation transistors connected with each other, as well as voltage lines under the functional transistors and the isolation transistors. Furthermore, the present embodiments provide one or more of the following advantage. In general, the gate structures and the nanostructures of the isolation transistors are removed and replaced with dielectric material for electrical isolation, such that the active areas between the adjacent circuit cells are not continuous or the active area is cut off. The continuous active areas in the present disclosure may improve the stress of the channel of the transistors in the circuit cells, such that cell performances of the circuit cells are improved. Further, the voltage lines at the back side of the device region in the present disclosure may reduce the routing complexity at the front side of the device region and improve the circuit density. The less metal lines in the same side of the device region also benefits the RC performance (may be either lower resistance (wider width) or lower capacitance (larger space), or both). Therefore, cell performance and routing complexity of the circuit cells are improved.

Thus, one of the embodiments of the present disclosure described a semiconductor device including circuit cells, isolation transistors at cell boundaries of the circuit cells, a first metal line under the isolation transistors, and connection structures connecting gate structures of the isolation transistors to the first metal line. Each of the circuit cells includes functional transistors having source/drain features and nanostructures. The isolation transistors electrically isolate the circuit cells from each other. Nanostructures of the isolation transistors, the source/drain features of the functional transistors, and the nanostructures of the functional transistors are connected with each other into a continuous rectangular shape from a top view.

In some embodiments, each of the connection structures includes a gate via under the isolation transistors. The gate via passes through a dielectric layer under the functional transistors and the isolation transistors.

In some embodiments, the semiconductor device further includes a source/drain contact under and connected to one of the source/drain features, and a via connecting the source/drain contact to the first metal line.

In some embodiments, each of the connection structures includes a source/drain contact under and connected to one of the source/drain features, and a butt via connecting the source/drain contact and one of the gate structures of the isolation transistors to the first metal line.

In some embodiments, each of the connection structures includes a butt contact under one of the source/drain features and a via connecting the butt contact to the first metal line. The butt contact connects the one of the source/drain features to one of the gate structures of the isolation transistors.

In some embodiments, the semiconductor device further includes a second metal line under the first metal line and a via connecting the second metal line to the first metal line.

In some embodiments, the semiconductor device further includes a second metal line over the isolation transistors and a gate via connecting one of gate structures of the functional transistors to the second metal line.

In some embodiments, the semiconductor device further includes a voltage source over the circuit cells and a tap structure connecting the first metal line to the voltage source.

In some embodiments, each of the gate structures of the isolation transistors includes a gate dielectric layer wrapping around the nanostructures and a gate electrode wrapping around the gate dielectric layer. The connection structures contact the gate electrode.

In some embodiments, the circuit cells are inverter, NAND, NOR, Flip-Flop, or a combination thereof.

In another of the embodiments, discussed is a semiconductor device including a circuit cell including N-type transistors and P-type transistors. Each of the N-type transistors shares a common gate with one of the P-type transistors. The semiconductor device further includes isolation transistors at cell boundaries of the circuit cell, front side metal lines over the N-type transistors, the P-type transistors, and the isolation transistors, front side gate vias connecting each of the common gates to one of the front side metal lines, back side metal lines under the N-type transistors, the P-type transistors, and the isolation transistors, and connection structures connecting gate structures of the isolation transistors to one of the back side metal lines.

In some embodiments, the isolation transistors include N-type isolation transistors and P-type isolation transistors. The gate structures of the P-type isolation transistors align to the gate structures of the N-type isolation transistors.

In some embodiments, the semiconductor device further includes gate end dielectrics separating the N-type isolation transistors from the P-type isolation transistors.

In some embodiments, the back side metal lines include a VDD voltage metal line and a VSS voltage metal line. The connection structures connecting the gate structures of the P-type isolation transistors to the VDD voltage metal line. The connection structures connecting the gate structures of the N-type isolation transistors to the VSS voltage metal line.

In some embodiments, the semiconductor device further includes a first active area and a second active area. The first active area includes first nanostructures of the N-type transistors and the N-type isolation transistors, and first source/drain features of the N-type transistors. The first nanostructures and the first source/drain features are connected with each other. The second active area includes second nanostructures of the P-type transistors and the P-type isolation transistors, and second source/drain features of the P-type transistors. The second nanostructures and the second source/drain features are connected with each other.

In some embodiments, each of the connection structures includes a back side butt contact connecting the one of the first source/drain features to one of the gate structures of the isolation transistors, and a back side via connecting the butt contact to one of the back side metal lines.

In yet another of the embodiments, discussed is a semiconductor device including circuit cells. Each of the circuit cells includes functional transistors. Each of the functional transistors includes first nanostructures and source/drain features. The semiconductor device further includes isolation transistors at cell boundaries of the circuit cells, a first metal line and a second metal line under the functional transistors and the isolation transistors, and connection structures connecting gate structures of the isolation transistors to the first metal line or the second metal line. The isolation transistors electrically isolate the circuit cells from each other, and second nanostructures of the isolation transistors contact the source/drain features of the functional transistors.

In some embodiments, each of the connection structures includes a source/drain contact under the functional transistors and connected to one of the source/drain features, and a butt via connecting the source/drain contact and one of the gate structures of the isolation transistors to the first metal line or the second metal line.

In some embodiments, each of the connection structures includes a butt contact under the functional transistors and a via connecting the butt contact to the first metal line or the second metal line. The butt contact connecting one of the source/drain features to one of the gate structures of the isolation transistors.

In some embodiments, the first metal line is a VDD voltage line and a second metal line is a VSS voltage line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   circuit cells, wherein each of the circuit cells comprises functional transistors having source/drain features and nanostructures;
   isolation transistors at cell boundaries of the circuit cells, wherein the isolation transistors electrically isolate the circuit cells from each other, wherein nanostructures of the isolation transistors, the source/drain features of the functional transistors, and the nanostructures of the functional transistors are connected with each other into a continuous rectangular shape from a top view;
   a first metal line under the isolation transistors; and
   connection structures connecting gate structures of the isolation transistors to the first metal line.

2. The semiconductor device of claim 1, wherein each of the connection structures comprises:
   a gate via under the isolation transistors, wherein the gate via passes through a dielectric layer under the functional transistors and the isolation transistors.

3. The semiconductor device of claim 2, further comprising:
a source/drain contact under and connected to one of the source/drain features;
a via connecting the source/drain contact to the first metal line.

4. The semiconductor device of claim 1, wherein each of the connection structures comprising:
a source/drain contact under and connected to one of the source/drain features; and
a butt via connecting the source/drain contact and one of the gate structures of the isolation transistors to the first metal line.

5. The semiconductor device of claim 1, wherein each of the connection structures comprises:
a butt contact under one of the source/drain features, wherein the butt contact connects the one of the source/drain features to one of the gate structures of the isolation transistors; and
a via connecting the butt contact to the first metal line.

6. The semiconductor device of claim 1, further comprising:
a second metal line under the first metal line; and
a via connecting the second metal line to the first metal line.

7. The semiconductor device of claim 1, further comprising:
a second metal line over the isolation transistors; and
a gate via connecting one of gate structures of the functional transistors to the second metal line.

8. The semiconductor device of claim 1, further comprising:
a voltage source over the circuit cells; and
a tap structure connecting the first metal line to the voltage source.

9. The semiconductor device of claim 1, wherein each of the gate structures of the isolation transistors comprising:
a gate dielectric layer wrapping around the nanostructures; and
a gate electrode wrapping around the gate dielectric layer, wherein the connection structures contact the gate electrode.

10. The semiconductor device of claim 1, wherein the circuit cells are inverter, NAND, NOR, Flip-Flop, or a combination thereof.

11. A semiconductor device, comprising:
a circuit cell comprising N-type transistors and P-type transistors, wherein each of the N- type transistors shares a common gate with one of the P-type transistors;
isolation transistors at cell boundaries of the circuit cell;
front side metal lines over the N-type transistors, the P-type transistors, and the isolation transistors;
front side gate vias connecting each of the common gates to one of the front side metal lines;
back side metal lines under the N-type transistors, the P-type transistors, and the isolation transistors; and
connection structures connecting gate structures of the isolation transistors to one of the back side metal lines.

12. The semiconductor device of claim 11, wherein the isolation transistors comprising:
N-type isolation transistors; and
P-type isolation transistors, wherein the gate structures of the P-type isolation transistors align to the gate structures of the N-type isolation transistors.

13. The semiconductor device of claim 12, further comprising:
gate end dielectrics separating the N-type isolation transistors from the P-type isolation transistors.

14. The semiconductor device of claim 12, wherein the back side metal lines comprising:
a VDD voltage metal line, wherein the connection structures connecting the gate structures of the P-type isolation transistors to the VDD voltage metal line; and
a VSS voltage metal line, wherein the connection structures connect the gate structures of the N-type isolation transistors to the VSS voltage metal line.

15. The semiconductor device of claim 12, further comprising:
a first active area, comprising:
first nanostructures of the N-type transistors and the N-type isolation transistors, and
first source/drain features of the N-type transistors, wherein the first nanostructures and the first source/drain features are connected with each other; and
a second active area, comprising:
second nanostructures of the P-type transistors and the P-type isolation transistors; and
second source/drain features of the P-type transistors, wherein the second nanostructures and the second source/drain features are connected with each other.

16. The semiconductor device of claim 15, wherein each of the connection structures comprising:
a back side butt contact connecting the one of the first source/drain features to one of the gate structures of the isolation transistors, and
a back side via connecting the butt contact to one of the back side metal lines.

17. A semiconductor device, comprising:
circuit cells, wherein each of the circuit cells comprises functional transistors, and each of the functional transistors comprises first nanostructures and source/drain features;
isolation transistors at cell boundaries of the circuit cells, wherein the isolation transistors electrically isolate the circuit cells from each other, and second nanostructures of the isolation transistors contact the source/drain features of the functional transistors;
a first metal line and a second metal line under the functional transistors and the isolation transistors; and
connection structures connecting gate structures of the isolation transistors to the first metal line or the second metal line.

18. The semiconductor device of claim 17, wherein each of the connection structures comprising:
a source/drain contact under the functional transistors and connected to one of the source/drain features; and
a butt via connecting the source/drain contact and one of the gate structures of the isolation transistors to the first metal line or the second metal line.

19. The semiconductor device of claim 17, wherein each of the connection structures comprising:
a butt contact under the functional transistors, wherein the butt contact connects one of the source/drain features to one of the gate structures of the isolation transistors; and
a via connecting the butt contact to the first metal line or the second metal line.

20. The semiconductor device of claim 17, wherein the first metal line is a VDD voltage line and the second metal line is a VSS voltage line.

* * * * *